United States Patent
Qing et al.

(10) Patent No.: US 12,256,611 B2
(45) Date of Patent: Mar. 18, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Yunsheng Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 576 days.

(21) Appl. No.: 17/417,723

(22) PCT Filed: Nov. 4, 2020

(86) PCT No.: PCT/CN2020/126418
§ 371 (c)(1),
(2) Date: Jun. 23, 2021

(87) PCT Pub. No.: WO2021/098508
PCT Pub. Date: May 27, 2021

(65) Prior Publication Data
US 2022/0077273 A1    Mar. 10, 2022

(30) Foreign Application Priority Data

Nov. 22, 2019    (CN) .......................... 201911155559.0
Nov. 2, 2020    (CN) .......................... 202011202265.1

(51) Int. Cl.
*H10K 59/131*    (2023.01)
*G09G 3/00*    (2006.01)
(Continued)

(52) U.S. Cl.
CPC .......... *H10K 59/131* (2023.02); *G09G 3/006* (2013.01); *H01L 27/0248* (2013.01);
(Continued)

(58) Field of Classification Search
None
See application file for complete search history.

(56) References Cited

U.S. PATENT DOCUMENTS

2008/0315788 A1* 12/2008 Levey .................. G09G 3/3233
315/291
2010/0103159 A1* 4/2010 Leon .................... G09G 3/3233
345/212
(Continued)

FOREIGN PATENT DOCUMENTS

CN      106019659 A    10/2016
CN      106790811 A    5/2017
(Continued)

*Primary Examiner* — Cory W Eskridge
(74) *Attorney, Agent, or Firm* — MUNCY, GEISSLER, OLDS & LOWE, P.C.

(57) ABSTRACT

A display substrate and a display device are provided. The display substrate includes a base substrate, multiple sub-pixels, multiple data lines, a test circuit, multiple data leads, at least one test pad, and at least one first test signal line. The multiple data lines are electrically connected to the multiple sub-pixels, and configured to provide data signals to the multiple sub-pixels. The multiple data leads are electrically connected to the multiple data lines and the test circuit. At least one test pad is located on at least one side of the test circuit. The at least one first test signal line is electrically connected to at least one test pad and the test circuit, and includes at least two conductive layers connected in parallel and electrically connected to each other.

19 Claims, 9 Drawing Sheets

(51) Int. Cl.
*H01L 27/02* (2006.01)
*H10K 59/121* (2023.01)
*H10K 59/35* (2023.01)

(52) U.S. Cl.
CPC ..... *H10K 59/1213* (2023.02); *H10K 59/1216* (2023.02); *H10K 59/353* (2023.02)

(56) References Cited

U.S. PATENT DOCUMENTS

| | | | | |
|---|---|---|---|---|
| 2010/0156766 A1* | 6/2010 | Levey | ................ | G09G 3/3233 |
| | | | | 345/78 |
| 2010/0277400 A1* | 11/2010 | Jeong | ................ | G09G 3/3275 |
| | | | | 345/76 |
| 2013/0257845 A1* | 10/2013 | Chaji | ................ | G09G 3/3258 |
| | | | | 345/212 |
| 2014/0329339 A1* | 11/2014 | Chaji | ................ | G09G 3/006 |
| | | | | 438/10 |
| 2017/0054102 A1* | 2/2017 | Hong | ................ | H10K 50/8445 |
| 2017/0346280 A1* | 11/2017 | Stockinger | ......... | G01R 31/2856 |
| 2018/0218663 A1 | 8/2018 | Guo et al. | | |

FOREIGN PATENT DOCUMENTS

| | | | |
|---|---|---|---|
| CN | 108364934 A | 8/2018 | |
| CN | 108957885 A | 12/2018 | |
| CN | 109003566 A | 12/2018 | |
| CN | 209044228 U | 6/2019 | |

* cited by examiner

DISPLAY SUBSTRATE AND DISPLAY DEVICE

CROSS-REFERENCE TO RELATED APPLICATIONS

This application is the U.S. national phase of PCT Application No. PCT/CN2020/126418 filed on Nov. 4, 2020, which claims a priority to Chinese Patent Application No. 201911155559.0 filed on Nov. 22, 2019, and a priority to Chinese Patent Application No. 202011202265.1 filed on Nov. 2, 2020, the disclosures of which are incorporated in their entireties by reference herein.

TECHNICAL FIELD

The present disclosure relates to a display substrate and a display device.

BACKGROUND

In the display industry, with the continuous development of display technologies, the market for flexible organic light-emitting diode (OLED) display panels is growing. In order to occupy a certain proportion in the future market competition, production enterprises pay more and more attention to the improvement of the yield rate.

SUMMARY

At least one embodiment of the present disclosure provides a display substrate. The display substrate includes: a base substrate, a plurality of sub-pixels, a plurality of data lines, a test circuit, a plurality of data leads, at least one test pad, and at least one first test signal line. The base substrate includes a display area and a peripheral area on at least one side of the display area. The plurality of sub-pixels are located in the display area. The plurality of data lines are located in the display area and are electrically connected to the plurality of sub-pixels, and are configured to provide data signals to the plurality of sub-pixels. The test circuit is located in the peripheral area; the plurality of data leads are located in the peripheral area and are electrically connected to the plurality of data lines and the test circuit. At least one test pad is located in the peripheral area and located on at least one side of the test circuit; and the at least one first test signal line is located in the peripheral area. The at least one first test signal line is electrically connected to at least one test pad and the test circuit. At least part of the at least one first test signal line includes at least two conductive layers connected in parallel and electrically connected to each other.

For example, in the display substrate provided by at least one embodiment of the present disclosure, at least a part of the at least one first test signal line includes three conductive layers that are connected in parallel and electrically connected to each other.

For example, in the display substrate provided by at least one embodiment of the present disclosure, each first test signal line of the at least one first test signal line includes a first part and a second part, the first part extends in a first direction, and the second part extends in a direction crossing the first direction; and the first part is electrically connected to the at least one test pad and the second part, and the second part is further electrically connected to the test circuit.

For example, in the display substrate provided by at least one embodiment of the present disclosure, the first part of the at least one first test signal line includes a first sub-conductive layer, a second sub-conductive layer, and a third sub-conductive layer, the first sub-conductive layer, the second sub-conductive layer, and the third sub-conductive layer are separated by insulating layers, and are electrically connected in parallel through via holes in the insulating layers.

For example, in the display substrate provided by at least one embodiment of the present disclosure, each of the plurality of sub-pixels includes a pixel structure, and the pixel structure includes a pixel driving circuit. The pixel driving circuit includes a first metal layer, a second metal layer, and a third metal layer, the first metal layer is on the base substrate, the second metal layer is on a side of the first metal layer away from the base substrate, and the third metal layer is on a side of the second metal layer away from the base substrate; and the first sub-conductive layer is arranged in a same layer as the first metal layer, the second sub-conductive layer is arranged in a same layer as the second metal layer, and the third sub-conductive layer is arranged in a same layer as the third metal layer.

For example, in the display substrate provided by at least one embodiment of the present disclosure, the pixel driving circuit further includes a driving transistor, a storage capacitor, a first insulating layer, a second insulating layer, and an interlayer insulating layer. The first insulating layer is on a side of the first metal layer close to the base substrate, the second insulating layer is located between the first metal layer and the second metal layer, and the interlayer insulating layer is between the second metal layer and the third metal layer. The first transistor includes a gate electrode, a source electrode, a drain electrode, and an active layer, and the storage capacitor includes a first electrode plate and a second electrode plate. The active layer is on a side of the first insulating layer close to the base substrate, the gate electrode and the first electrode plate are located in the first metal layer, the second electrode plate is in the second metal layer, and the source electrode and the drain electrode are in the third metal layer, the first sub-conductive layer and the second sub-conductive layer are electrically connected in parallel through a via hole that penetrates the second insulating layer, and the second sub-conductive layer and the third sub-conductive layer are electrically connected in parallel by through a via hole that penetrates the interlayer insulating layer.

For example, the display substrate provided by at least one embodiment of the present disclosure further includes a plurality of test pad leads and a plurality of second test signal lines. The at least one first test signal line includes a plurality of first test signal lines, the at least one test pad includes a plurality of test pads. The plurality of test pad leads extends along a second direction different from the first direction, and is electrically connected to the plurality of test pads, respectively. A part of the plurality of test pad leads is electrically connected to the first parts of the plurality of first test signal lines, and the plurality of second test signal lines are electrically connected to the test circuit and the plurality of first test signal lines. Orthographic projections of the second parts of the plurality of first test signal lines onto the base substrate partially overlap with orthographic projections of the plurality of second test signal lines onto the base substrate.

For example, in the display substrate provided by at least one embodiment of the present disclosure, the second part of each of the plurality of first test signal lines includes the first sub-conductive layer and the second sub-conductive layer, and the plurality of second test signal lines and the third metal layer are arranged in a same layer.

For example, in the display substrate provided by at least one embodiment of the present disclosure, the test circuit includes a plurality of test units, and at least one of the plurality of test units includes a first multiplexing switch, a second multiplexing switch, a third multiplexing switch, a first control line, a second control line, a third control line, a first signal line, a second signal line and a third signal line. The plurality of second test signal lines is electrically connected to the first control line, the second control line, the third control line, the first signal line, the second signal line and the third signal line. At least one gate electrode of the first multiplexing switch is electrically connected to the first control line or the third control line, at least one source electrode of the first multiplexing switch is electrically connected to the first signal line or the second signal line, and at least one drain electrode of the first multiplexing switch is electrically connected to one data lead of the plurality of data leads. At least one gate electrode of the second multiplexing switch is electrically connected to the first control line or the third control line, at least one source electrode of the second multiplexing switch is electrically connected to the first signal line or the second signal line, and at least one drain electrode of the second multiplexing switch is electrically connected to another one data lead of the plurality of data leads. At least one gate electrode of the third multiplexing switch is electrically connected to the second control line, at least one source electrode of the third multiplexing switch is electrically connected to the third signal line, and at least one drain electrode of the third multiplexing switch is electrically connected to the one data lead of the plurality of data leads and the other one data lead of the plurality of data leads.

For example, in the display substrate provided by at least one embodiment of the present disclosure, the first multiplexing switch includes a first multiplexing switch active layer, a first multiplexing switch first gate electrode, a first multiplexing switch second gate electrode, a first multiplexing switch drain electrode, a first multiplexing switch first source electrode, and a first multiplexing switch second source electrode. The first multiplexing switch active layer is on the base substrate, the first multiplexing switch first gate electrode and the first multiplexing switch second gate electrode are located on a side of the first multiplexing switch active layer away from the base substrate, and an orthographic projection of the first multiplexing switch first gate electrode onto the base substrate is spaced apart from an orthographic projection of the first multiplexing switch second gate electrode onto the base substrate. The first multiplexing switch drain electrode, the first multiplexing switch first source electrode, and the first multiplexing switch second source electrode are located on a side of the first multiplexing switch first gate electrode and the first multiplexing switch second gate electrode away from the base substrate, and the first multiplexing switch drain electrode is located between the first multiplexing switch first source electrode and the first multiplexing switch second source electrode. An orthographic projection of the first multiplexing switch first gate electrode onto the base substrate is located between orthographic projections of the first multiplexing switch first source electrode and the first multiplexing switch drain electrode onto the base substrate, an orthographic projection of the first multiplexing switch second gate electrode onto the base substrate is located between orthographic projections of the first multiplexing switch second source electrode and the first multiplexing switch drain electrode onto the base substrate. The first multiplexing switch first gate electrode is electrically connected to the first control line, and the first multiplexing switch second gate electrode is electrically connected to the third control line.

For example, in the display substrate provided by at least one embodiment of the present disclosure, the second multiplexing switch includes a second multiplexing switch active layer, a second multiplexing switch first gate electrode, a second multiplexing switch second gate electrode, a second multiplexing switch drain electrode, a second multiplexing switch first source electrode and a second multiplexing switch second source electrode. The second multiplexing switch active layer is located on the base substrate, the second multiplexing switch first gate electrode and the second multiplexing switch second gate electrode are located on a side of the second multiplexing switch active layer away from the base substrate, and an orthographic projection of the second multiplexing switch first gate electrode onto the base substrate is spaced apart from an orthographic projection of the second multiplexing switch second gate electrode onto the base substrate. The second multiplexing switch drain electrode, the second multiplexing switch first source electrode, and the second multiplexing switch second source electrode are located on a side of the second multiplexing switch first gate electrode and the second multiplexing switch second gate electrode away from the base substrate, and the second multiplexing switch drain electrode is located between the second multiplexing switch first source electrode and the second multiplexing switch second source electrode. An orthographic projection of the second multiplexing switch first gate electrode onto the base substrate is located between orthographic projections of the second multiplexing switch first source electrode and the second multiplexing switch drain electrode onto the base substrate, an orthographic projection of the second multiplexing switch second gate electrode onto the base substrate is located between orthographic projections of the second multiplexing switch second source electrode and the second multiplexing switch drain electrode onto the base substrate. The second multiplexing switch first gate electrode is electrically connected to the first control line, and the second multiplexing switch second gate electrode is electrically connected to the third control line.

For example, in the display substrate provided by at least one embodiment of the present disclosure, the third multiplexing switch includes a third multiplexing switch active layer, a third multiplexing switch first gate electrode, a third multiplexing switch second gate electrode, a third multiplexing switch source electrode, a third multiplexing switch first drain electrode and a third multiplexing switch second drain electrode. The third multiplexing switch active layer is located on the base substrate, the third multiplexing switch first gate electrode and the third multiplexing switch second gate electrode are located on a side of the third multiplexing switch active layer away from the base substrate, and an orthographic projection of the third multiplexing switch first gate electrode onto the base substrate is spaced apart from an orthographic projection of the third multiplexing switch second gate electrode onto the base substrate. The third multiplexing switch source electrode, the third multiplexing switch first drain electrode, and the third multiplexing switch second drain electrode are located on a side of the third multiplexing switch first gate electrode and the third multiplexing switch second gate electrode away from the base substrate, and the third multiplexing switch source electrode is located between the third multiplexing switch first drain electrode and the third multiplexing switch second drain electrode. An orthographic projection of the third multiplexing switch first gate electrode onto the base substrate is located between orthographic projections of the third multiplexing switch first drain electrode and the third multiplexing switch source electrode onto the base substrate, an orthographic projection of the third multiplexing switch second gate electrode onto the base substrate is located between orthographic projections of the third multiplexing switch second drain electrode and the third multiplexing switch source electrode onto the base substrate. The third multiplexing switch first drain electrode is electrically connected to one of the plurality of data leads, and the third multiplexing switch second drain electrode is electrically connected to another one of the plurality of data leads.

For example, in the display substrate provided by at least one embodiment of the present disclosure, the peripheral area further includes a first bonding area, the first bonding area is on a side of the test circuit away from the display area, the first bonding area is spaced apart from the at least one test pad in the first direction, and the first bonding area is configured to be bond to a signal input element, and includes a plurality of contact pads. A part of the plurality of contact pads is electrically connected to the test circuit.

For example, the display substrate provided by at least one embodiment of the present disclosure further includes a plurality of signal leads, where the plurality of signal leads is electrically connected to another part of the plurality of contact pads and the test circuit. At least one drain electrode of the first multiplexing switch is also electrically connected to one of the plurality of signal leads, and at least one drain electrode of the second multiplexing switch is also electrically connected to another one of the plurality of signal leads.

For example, in the display substrate provided by at least one embodiment of the present disclosure, the plurality of contact pads includes a plurality of first contact pads, the second part of each of the plurality of first test signal lines and each of the plurality of second test signal lines extend to one end of the plurality of first contact pads away from the first bonding area, and are electrically connected to the one end of a corresponding one of the first contact pads away from the first bonding area.

For example, the display substrate provided by at least one embodiment of the present disclosure further includes: a first power supply line and a second power supply line located in the peripheral area, where the first power supply line is located on a side of the second power supply line close to the test pad. The plurality of contact pads further includes a plurality of second contact pads, and the plurality of second contact pads is located on a side of the plurality of first contact pads close to the at least one test pad. The first power supply line is configured to supply a first power supply signal to the plurality of sub-pixels, and the first power supply line is electrically connected to a part of the plurality of second contact pads and surrounds the display area. The second power supply line is configured to supply a second power supply signal to the plurality of sub-pixels, and the second power supply signal is electrically connected to another part of the plurality of second contact pads and extends to the display area. The first power supply line and the second power supply line are located on a side of the second parts of the plurality of first test signal lines away from the base substrate, and orthographic projections of the first power supply line and the second power supply line onto the base substrate overlap with orthographic projections of the second parts of the plurality of the first test signal lines onto the base substrate.

For example, the display substrate provided by at least one embodiment of the present disclosure further includes: at least one first electrostatic discharge unit, the at least one first electrostatic discharge unit is located on a side of the plurality of test pads close to the display area, and at least part of the plurality of test pad leads passes through the at least one first electrostatic discharge unit, and is connected to the at least one first electrostatic discharge unit.

For example, the display substrate provided by at least one embodiment of the present disclosure further includes: at least one second electrostatic discharge unit and at least one electrostatic lead located in the peripheral area, where the at least one second electrostatic discharge unit is located between the plurality of test pads and the first bonding area in the first direction, and the at least one electrostatic lead extends in the second direction, and is electrically connected to at least one of the plurality of first test signal lines and the at least one second electrostatic discharge unit, respectively.

For example, in the display substrate provided by at least one embodiment of the present disclosure, the at least one electrostatic lead includes a plurality of electrostatic leads, and the plurality of electrostatic leads are arranged in parallel in the first direction. The first parts of the plurality of first test signal lines are arranged in parallel in the second direction, and are electrically connected to the plurality of electrostatic leads, respectively. Orthographic projections of the first parts of the plurality of first test signal lines onto the base substrate overlap with orthographic projections of the plurality of electrostatic leads onto the base substrate, and an overlapping portion where the first parts of the plurality of first test signal lines overlap with the plurality of electrostatic leads includes the first sub-conductive layer and the second sub-conductive layer.

For example, the display substrate provided by at least one embodiment of the present disclosure further includes: a shift register unit, a light-emission control unit, a first clock signal line, a second clock signal line, a third clock signal located, a fourth clock signal line, a first trigger signal line, a second trigger signal line, a third power supply line, a fourth power supply line, and an initialization signal line that are located in the peripheral area. The shift register unit is configured to provide a gate scan signal to the plurality of sub-pixels, and the light-emission control unit is configured to provide a light-emission control signal to the plurality of sub-pixels. The first clock signal line, the second clock signal line and the first trigger signal line are electrically connected to the shift register unit to provide a first clock signal, a second clock signal and a first trigger signal, respectively. The third clock signal line, the fourth clock signal line and the second trigger signal line are electrically connected to the light-emission control unit to provide a third clock signal, a fourth clock signal and a second trigger signal, respectively. The third power supply line and the fourth power supply line are respectively electrically connected to the shift register unit and the light-emission control unit to provide a third power supply signal and a fourth power supply signal, respectively. The initialization signal line is configured to provide an initialization signal to the plurality of sub-pixels. The display substrate further includes a plurality of bending lines located on a side of the plurality of first test signal lines close to the display area, and the plurality of bending lines are respectively electrically connected to at least two of following lines: the first clock signal line, the second clock signal line, the third clock signal line, the fourth clock signal line, the first trigger signal line, the second trigger signal line, the third power supply line, the fourth power supply line and the initialization signal line. The plurality of bending lines is also electrically connected to another part of the contact pads, and orthographic projections of the plurality of bending lines onto the base substrate overlap with orthographic projections of the first power supply line, the second power supply line and the second test signal line onto the base substrate. Each of the plurality of bending lines includes two conductive layers, and the two conductive layers of the bending lines are respectively arranged in the same layers as the first metal layer and the second metal layer.

For example, in the display substrate provided by at least one embodiment of the present disclosure, the plurality of bending lines is also electrically connected to another part of the test pad leads, the orthographic projections of the first parts of the plurality of first test signal lines onto the base substrate overlap with an orthographic projection of the other part of the test pad leads electrically connected to the plurality of bending lines onto the base substrate. An overlapping portion include the first sub-conductive layer and the second sub-conductive layer, and the overlapping portion is a portion of the first parts of the plurality of first test signal lines that overlaps with the other part of the test pad leads electrically connected to the plurality of bending lines.

At least one embodiment of the present disclosure provides a display device including the display substrate described in any one of the above embodiments.

BRIEF DESCRIPTION OF THE DRAWINGS

In order to explain technical solutions of embodiments of the present disclosure more clearly, the drawings of the embodiments will be briefly introduced below. Obviously, the drawings in the following description only relate to some embodiments of the present disclosure, rather than limit the present disclosure.

DETAILED DESCRIPTION

Figure 1:
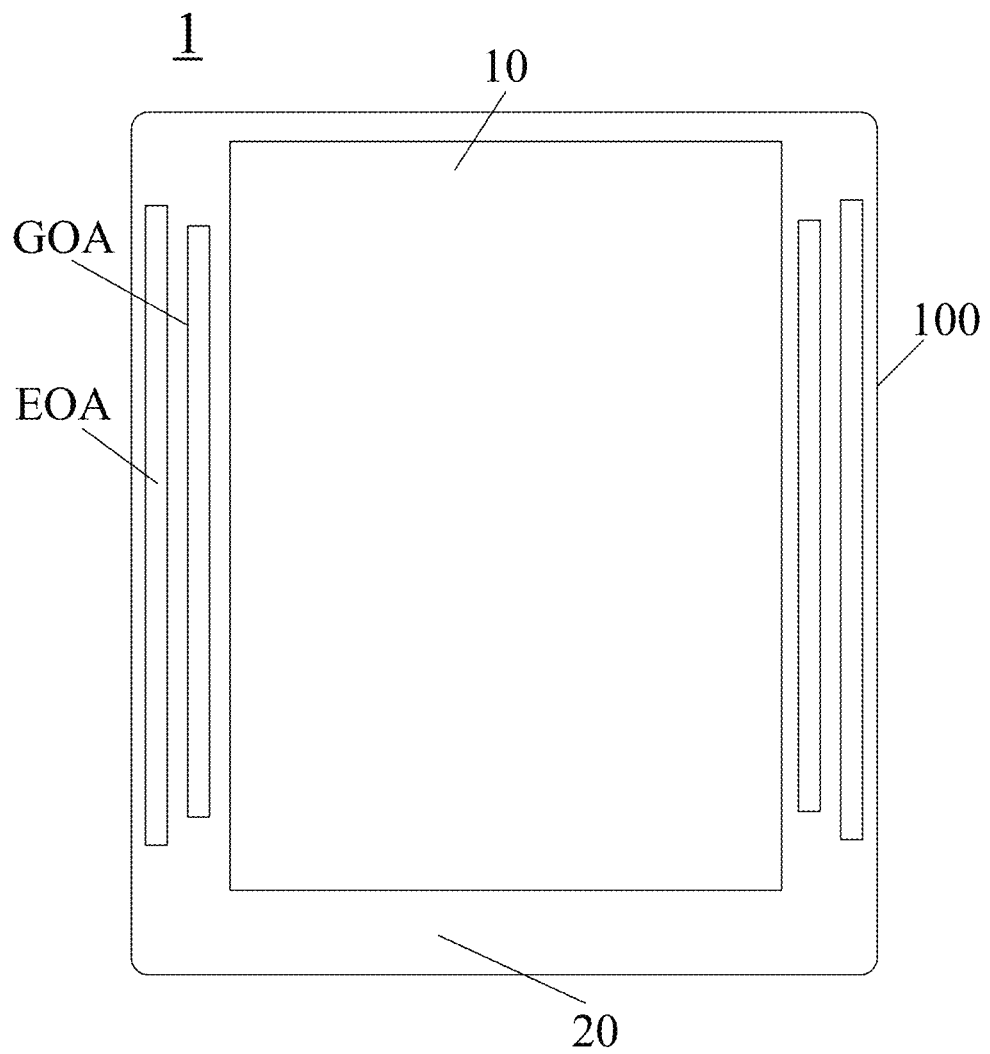
FIG. 1 is a schematic diagram of a display substrate provided by an embodiment of the present disclosure.

In order to make objectives, technical solutions, and advantages of the embodiments of the present disclosure clearer, the technical solutions of the embodiments of the present disclosure will be described clearly and completely in conjunction with the accompanying drawings of the embodiments of the present disclosure. Obviously, the described embodiments are part of the embodiments of the present disclosure, rather than all of the embodiments. Based on the described embodiments of the present disclosure, all other embodiments obtained by those of ordinary skill in the art without creative effort are within the protection scope of the present disclosure.

Unless otherwise defined, technical terms or scientific terms used in the present disclosure shall have the usual meanings understood by those with ordinary skills in the field to which the present disclosure belongs. Similar words such as "first", "second" used in the present disclosure do not indicate any order, quantity or importance, but are only used to distinguish different components. Similarly, similar words such as "a", "an" or "the" do not mean a quantity limit, but rather mean at least one. "Include" or "comprise" and other similar words mean that an element or item appearing before the word cover elements or items listed after the word and their equivalents. For the convenience of description, in some drawings, "top", "bottom", "front", and "back" are given. In the embodiments of the present disclosure, a vertical direction is a direction from top to bottom, the vertical direction is also the direction of gravity; a horizontal direction is a direction perpendicular to the vertical direction, and the horizontal direction from right to left is a direction from front to back.

During the process of manufacturing a display panel, after the packaging process of the display panel is completed, processes such as an aging process, lighting detection, and leakage current checking are required. The aging process is an important transistor aging method in the industry of panel displays. Through the high-voltage process of the aging process, transistors in the display panel are aged to a stable state and the leakage current of each transistor is reduced. For AMOELD (Active-matrix organic light-emitting diode, active-matrix organic light-emitting diode), another important role of this process is to eliminate poor characteristic bright spots, especially for flexible OLED products. Affected by a limit of a critical temperature (for example, flexible display panel<450° C., rigid display panel<<550° C.) of some organic film layers (such as planarization layer), film defects caused by the doping process of the active layer or the deposition process of some conductive film layers (the main reason for characteristic highlights) cannot be filled by diffusion through a high-temperature thermal process, so the characteristic highlights of flexible OLED need to be repaired with a higher voltage in the aging process, so as to improve the product yield of display panels. However, excessive voltage in the aging process may quickly generate heat on traces of a back plate of the display panel, causing the organic film layer to undergo violent deformation and make the circuit traces broken (hereinafter referred to as burnt or burn), further causing display abnormalities.

Therefore, the aging process needs to balance both the risks of burnt and elimination of characteristic highlights in order to achieve the minimum drop of the product yield. However, affected by the aging process, the burns and the characteristic highlights are in dynamic balance, and it is not easy for engineering execution. Therefore, reducing the risk of burns of the display panel during the aging process and further improving the product yield are technical problems that need to be resolved at present.

At least one embodiment of the present disclosure provides a display substrate. The display substrate includes: a base substrate, a plurality of sub-pixels, a plurality of data lines, a test circuit, a plurality of data leads, at least one test pad, and at least one first test signal line. The base substrate includes a display area and a peripheral area at least on one side of the display area. The plurality of sub-pixels are located in the display area. The plurality of data lines are located in the display area and are electrically connected to the plurality of sub-pixels, and are configured to provide data signals to the plurality of sub-pixels. The test circuit is located in the peripheral area; the plurality of data leads are located in the peripheral area and are electrically connected to the plurality of data lines and the test circuit. At least one test pad is located in the peripheral area and located on at least one side of the test circuit; and the at least one first test signal line is located in the peripheral area. The at least one first test signal line is electrically connected to at least one test pad and the test circuit. At least part of the at least one first test signal line includes at least two conductive layers connected in parallel and electrically connected to each other.

In the display substrate provided by the foregoing embodiments, at least a part of at least one first test signal line includes at least two conductive layers connected in parallel and electrically connected to each other, so that a wiring resistance of the first test signal line can be reduced. Therefore, during the aging process, the heat quantity generated by the first test signal line is reduced and the heat dissipation is increased, thereby being beneficial to solve the problem of burns in the traces during the aging process and improving the product yield of display panels.

At least one embodiment of the present disclosure also provides a display device including the above-mentioned display substrate.

Embodiments and examples of the present disclosure will be described in detail below with reference to the accompanying drawings.

FIG. 1 is a schematic diagram of a display substrate provided by an embodiment of the present disclosure. As shown in FIG. 1, the display substrate 1 includes a base substrate 100. For example, the display substrate 1 is a partial structural diagram of a product with a COF (chip on film, or chip on flex) structure. The base substrate 100 includes a display area 10 and a peripheral area 20 on at least one side of the display area 20. For example, in the example shown in this figure, the peripheral area 20 surrounds the display area 10.

Manufacturers of display devices, such as mobile phone manufacturers, usually pursue smaller and smaller bezels, especially narrower lower frames, and therefore try to reduce the "chin" of a display device to achieve a mobile phone screen with a larger screen-to-body ratio.

For example, the base substrate 100 may be a glass plate, a quartz plate, a metal plate, or a resin plate and so on. For example, the material of the base substrate may include an organic material. For example, the organic material may be resin materials such as polyimide, polycarbonate, polyacrylate, polyetherimide, polyethersulfone, polyethylene terephthalate, and polyethylene naphthalate. As an example, the base substrate 100 may be a flexible substrate or a non-flexible substrate, which is not limited in the embodiments of the present disclosure.

Figure 2A:
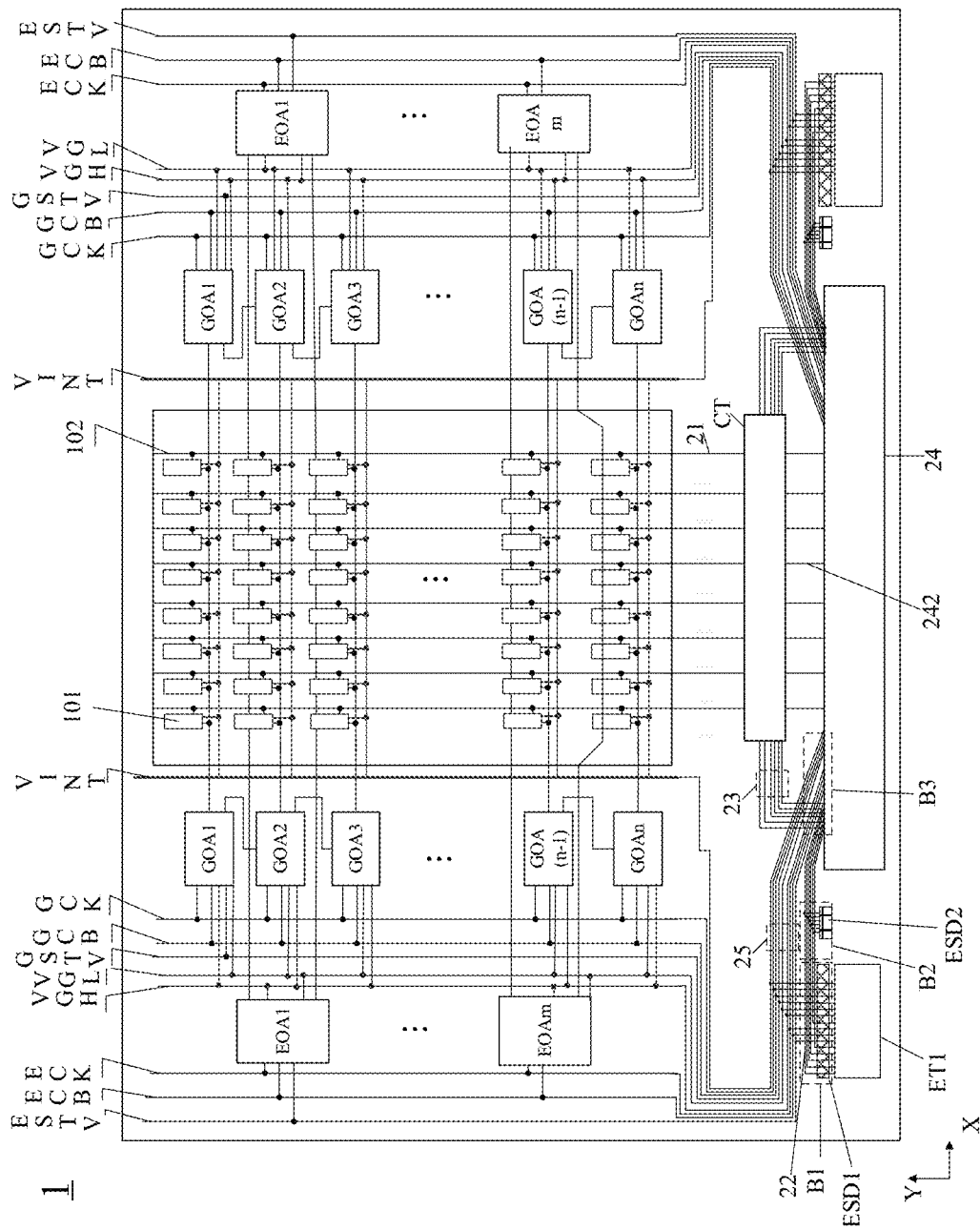
FIG. 2A is a schematic diagram of a display substrate provided by another embodiment of the present disclosure.

For example, FIG. 2A is a schematic diagram of a display substrate provided by another embodiment of the present disclosure. As shown in FIG. 2A, the display substrate 1 includes a plurality of sub-pixels 101, a plurality of data lines 102, a test circuit CT, a plurality of data leads 21, at least one test pad ET1, at least one first test signal line 22, a plurality of gate lines GN and a plurality of light-emission control lines EM. The plurality of sub-pixels 101 are located in the display area 10 and are arranged in an array along the first direction X and the second direction Y. The plurality of data lines 102 are located in the display area 10 and are electrically connected to multiple columns of sub-pixels 101, that is, each of the plurality of data lines 102 is electrically connected, in one-to-one relation, to one column of the plurality of sub-pixels 101 (for example, the column direction refers to the vertical direction of FIG. 1), and the plurality of data lines 102 are configured to provide data signals to the plurality of columns of sub-pixels 101. The plurality of gate lines GN pass through the display area 10 horizontally, and are electrically connected to the shift register GOA (as shown in FIG. 1) and a plurality of sub-pixels 101 (arranged in a horizontal row), the plurality of light-emission control lines EM are electrically connected to a light-emission control controller EOA (as shown in FIG. 1) and a plurality of sub-pixels 101 (arranged in a horizontal row), so as to provide the sub-pixels 101 with gate scanning signals and light-emission control signals.

The data signal provided by the data line 102 can cause the sub-pixel 101 to emit light under the cooperation of the gate scan signal and the light-emission control signal, so as to display a picture. For example, the data signal may be a numerical value within a predetermined range of grayscale values, for example, corresponding to grayscales such as 255 or 127 within the range of grayscale values ranging from 0 to 255. The test circuit CT is located in the peripheral area 20, that is, located below the display area 10 in the figure. The plurality of data leads 21 are located in the peripheral area 20 and are respectively electrically connected to the plurality of data lines 102 and the test circuit CT, that is, the plurality of data leads 21 are electrically connected to the plurality of data lines 102, respectively. The plurality of data leads 21 may also be regarded as a part of the plurality of data lines 102 extending to the peripheral area 20. The plurality of data leads 21 and the plurality of data lines 102 may provide electrical signals of the test circuit CT to the sub-pixels 101.

At least one test pad ET1 is located in the peripheral area 20 and on at least one side of the test circuit CT. The at least one test pad ET1 as shown in the figure may include a plurality of test pads ET1, for example, being arranged symmetrically on both sides of the test circuit CT and at intervals. The test pad ET1 is configured to be electrically connected to an external test circuit (such as bonding, probe contact, etc.) during a lighting test phase to apply a test signal to the sub-pixel 101 through the test circuit CT, and the sub-pixel 101 receives the test signal and displays at least one test image, so as to test performances of the sub-pixels 101 of the display substrate 1 in displaying a black-and-white image, a monochrome image, a gray-scale image, and so on.

As an example, the at least one first test signal line 22 may include a plurality of first test signal lines 22. The first test signal lines 22 are located in the peripheral area 20, and the first test signal lines 22 are electrically connected to the test pad ET1 and the test circuit CT. The first test signal line 22 includes at least two conductive layers connected in parallel and electrically connected to each other, that is, at least part of the first test signal lines 22 may be two layers of lines connected in parallel, or three layers of lines connected in parallel, etc. Alternatively, part of the first test signal lines 22 is two layers of lines connected in parallel, and another part of the first test signal lines 22 is three layers of lines connected in parallel. By increasing the number of conductive film layers of the first test signal lines 22, the wiring resistance of the first test signal lines can be reduced as a whole. Therefore, during the aging process, the heat quantity generated by the first test signal line is reduced and the heat dissipation is increased, thereby being beneficial to solve the problem of burns in the traces during the aging process and improving the product yield of display panels.

For example, as shown in FIG. 2A, the peripheral area 20 also includes a first bonding area 24. The first bonding area 24 is located on a side of the test circuit CT away from the display area 10 and below the test circuit CT. In the first direction X, the first bonding area 24 and the test pads ET1 located on both sides of the test circuit CT are spaced apart. The first bonding area 24 is configured to bond with a signal input element. For example, the signal input element includes an integrated circuit (IC), and for another example, the signal input element includes a data driving circuit IC. The signal input element provides a display signal to the display substrate 1 in the display stage, so that the sub-pixels 101 displays a picture.

Figure 3:
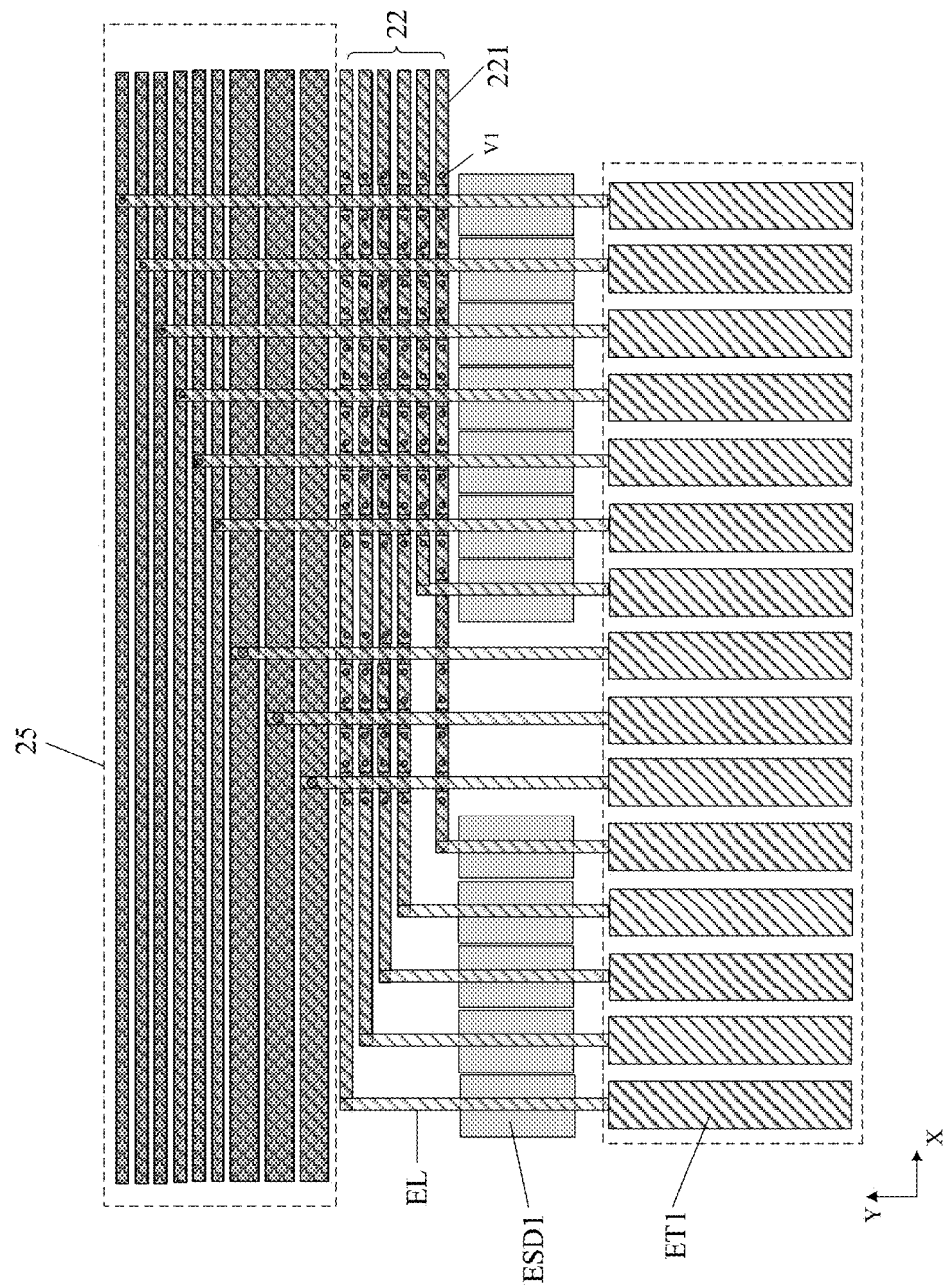
FIG. 3 is an enlarged schematic diagram of area B1 in FIG. 2A.
Figure 4:
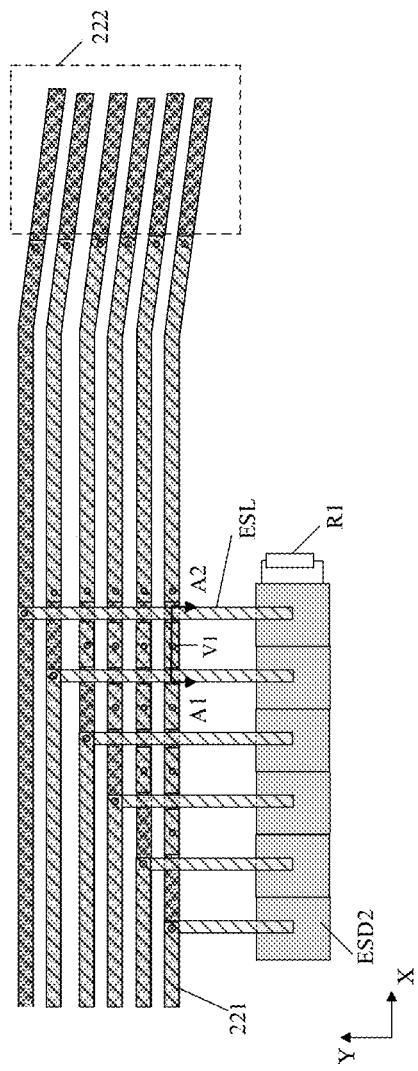
FIG. 4 is an enlarged schematic diagram of area B2 in FIG. 2A.
Figure 5:
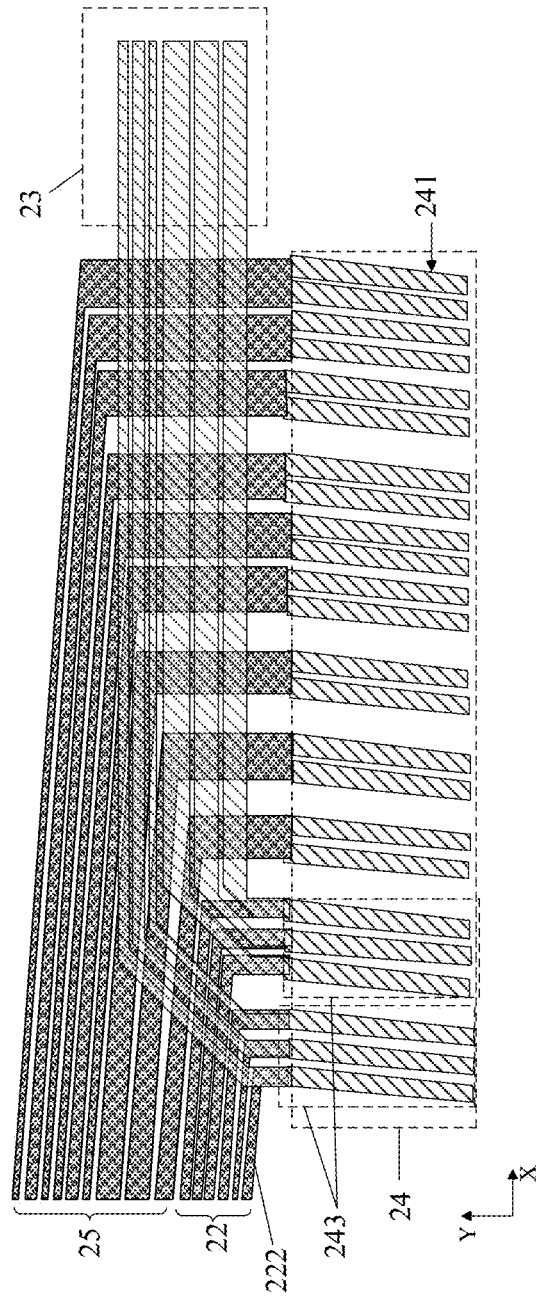
FIG. 5 is an enlarged schematic diagram of area B3 in FIG. 2A.

For example, in some embodiments, FIG. 3 is an enlarged schematic diagram of area B1 in FIG. 2A; FIG. 4 is an enlarged schematic diagram of area B2 in FIG. 2A; FIG. 5 is an enlarged schematic diagram of area B3 in FIG. 2A.

As shown in FIG. 3, FIG. 4 and FIG. 5, the first test signal line 22 includes a first part 221 and a second part 222. The first part 221 extends in the first direction X (the horizontal direction in the figure), and the second part 222 extends in a direction crossing the first direction X. As shown in FIG. 4, the second part 222 is deflected relative to the extending direction of the first part 221 and bends, so as to continue to extend in the direction close to the first bonding area 24, and then to be electrically connected to the test circuit CT. That is, the first part 221 of the first test signal line 22 is a horizontally extending part, and extends from the side of the test pad ET1 close to the display area 10 to the part close to the test circuit, and the second part 222 of the first test signal line 22 is a part bent and extended relative to the first part 221. The first part 221 is electrically connected to the test pad ET1 and the second part 222, and the second part 222 is also electrically connected to the test circuit CT, so that a test signal of an external test circuit electrically connected to the test pad ET1 is provided to the sub-pixel 101 through the test circuit CT.

Figure 6:
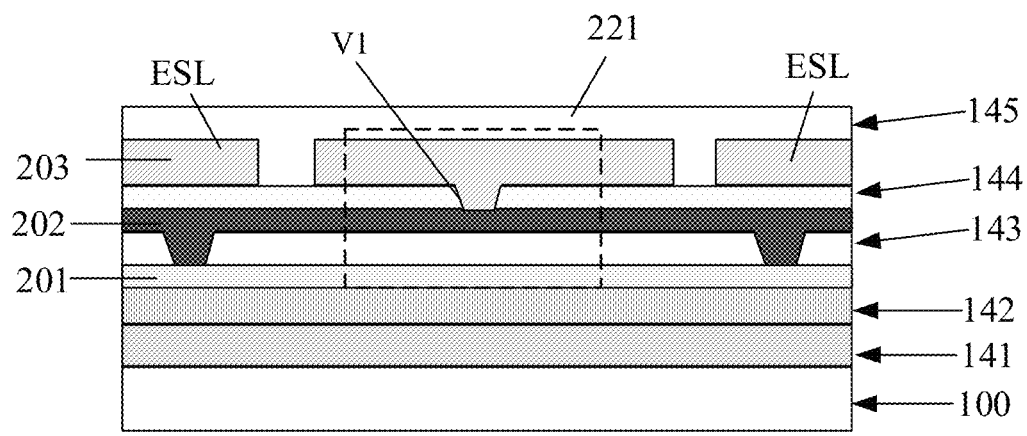
FIG. 6 is a schematic cross-sectional view taken along line A1-A2 in FIG. 4.

For example, in some embodiments, at least part of the at least one first test signal line includes three conductive layers connected in parallel with each other. FIG. 6 is a schematic cross-sectional view taken along the line A1-A2 in FIG. 4 according to an example. The lines A1-A2 are cut lines of a partial section of the first part 221 of the first test signal line 22. As shown in FIG. 4 and FIG. 6, the first part 221 of the first test signal line 22 includes a first sub-conductive layer 201, a second sub-conductive layer 202 and a third sub-conductive layer 203. The first conductive sub-layer 201, the second conductive sub-layer 202, and the third conductive sub-layer 203 are separated by insulating layers, and are electrically connected in parallel through via holes in the insulating layers. By arranging three conductive layers in parallel for the first test signal line 22, the wiring resistance of the first test signal line may be reduced as a whole. The formula for calculating the heat quantity generated by the resistance is as follows:

$$I^2 \times R \times t = Q \quad (1)$$

In the above formula, I represents a current flowing through a trace, R represents a resistance of the trace, t represents time, and Q represents the heat quantity. According to formula (1), when the resistance of the first test signal line 22 decreases, the heat quantity generated by the first test signal line 22 at the same time and current may decrease.

In addition, the heat conduction formula is as follows:

$$Q = CM\Delta T \quad (2)$$

In formula (2), C represents specific heat capacity, $\Delta T$ represents temperature change, and M represents mass. Therefore, when increasing the number of conductive film layers of the first test signal line 22, mass of the first test signal line 22 is also increased. According to formula (2), under the condition that other influencing factors remain unchanged, the amount of temperature change will decrease. As a result, the heat quantity transferred from the first test signal line 22 to other film layers is reduced. Therefore, during the aging process, the heat quantity generated by the first test signal line is reduced and the heat diffusion is increased, thereby helping to solve the problem of wire burnt during the aging process and improving the product yield of the display panels.

For example, as shown in FIG. 6, the display substrate 1 further includes a first insulating layer 142 (that is, a first gate insulating layer), a second insulating layer 143 (that is, a second gate insulating layer), and an interlayer insulating layer 144. The first insulating layer 142 is located on a base substrate 100 and is located on a side of the first sub-conductive layer 201 close to the base substrate 100. The second insulating layer 143 is located between the first sub-conductive layer 201 and the second sub-conductive layer 202. The interlayer insulating layer 144 is located between the second sub-conductive layer 202 and the third sub-conductive layer 203. The third sub-conductive layer 203 may be electrically connected to the second sub-conductive layer 202 through a plurality of via holes VI penetrating the interlayer insulating layer 144, thereby realizing a parallel electrical connection between the third sub-conductive layer 203 and the second sub-conductive layer 202. The first conductive sub-layer 201 and the second conductive sub-layer 202 may be electrically connected through a plurality of via holes penetrating the second insulating layer 143 to realize the parallel electrical connection between the first conductive sub-layer 201 and the second conductive sub-layer 202.

It should be noted that the number of via holes VI may be multiple, and one via hole is shown as an example in FIG. 6. The number of via holes for connecting the first sub-conductive layer 201 to the second sub-conductive layer 20 is not limited to two shown in the figure. For example, there may be a plurality of via holes distributed (evenly arranged) on the first test signal line 22. The embodiments of the present disclosure is not limited thereto.

For example, the materials of the first sub-conductive layer 201, the second sub-conductive layer 202, and the third sub-conductive layer 203 may include metal materials or alloy materials, such as a metal single-layer or multi-layer structure made of molybdenum, aluminum, and titanium, etc. For example, the multi-layer structure is a multi-metal-layer laminate (such as a three-layer metal laminate of titanium, aluminum and titanium (Ti/Al/Ti)). The embodiments of the present disclosure do not specifically limit the material of each functional layer.

For example, the material of one or more of the first insulating layer 142, the second insulating layer 143, and the interlayer insulating layer 144 may include insulating materials such as silicon oxide, silicon nitride, and silicon oxynitride. The materials of the first insulating layer 142, the second insulating layer 143, and the interlayer insulating layer 144 may be the same or different.

For example, as shown in FIG. 6, the display substrate 1 may further include a third insulating layer 145 (for example, a peripheral area planarization layer or a passivation layer). The third insulating layer 145 is located on a side of the third sub-conductive layer 203 away from the base substrate 100, to provide a flattened surface and provide protection for the first test signal line 22 and the electrostatic lead ESL.

For example, as shown in FIG. 6, the display substrate 1 may further include a buffer layer 141. The buffer layer 141 is located between the first insulating layer 142 and the base substrate 100. The buffer layer 141 serves as a transition layer, which may prevent harmful substances in the base substrate from invading the interior of the display substrate, and may also increase the adhesion of film layers in the display substrate relative to the base substrate 100. The material of the buffer layer 141 may include insulating materials such as silicon oxide, silicon nitride, and silicon oxynitride.

For example, as shown in FIG. 3, the number of the first test signal lines 22 is six. However, the example of the present disclosure is not limited to this, the number of the first test signal lines 22 may also be changed according to the requirements of the display panel design, and FIG. 3 is introduced as an example.

For example, as shown in FIG. 2A, FIG. 3 and FIG. 5, the display substrate 1 further includes a plurality of test pad leads EL and a plurality of second test signal lines 23, and the at least one test pad ET1 includes a plurality of test pads ET1. The plurality of test pad leads EL extend along the second direction Y (that is, the vertical direction in the figure) and are electrically connected to the plurality of test pads ET1 in a one-to-one correspondence. For example, the plurality of test pads ET1 as shown in FIG. 2A are distributed on both sides of the test circuit CT. In FIG. 3, a plurality of test pads ET1 located on one side of the test circuit CT is taken as an example. The arrangement of the plurality of test pads ET1 on the other side of the test circuit CT and the connection with traces are the same as those in FIG. 3, and will not be described in detail.

For example, as shown in FIG. 3, some test pad leads EL of the plurality of test pad leads EL are electrically connected to the first parts 221 of the plurality of first test signal lines 22. That is, the first test pad lead EL to the fifth test pad lead EL, and the ninth test pad lead EL numbering from the left in the figure are electrically connected to the first parts 221 of six first test signal lines 22, respectively. In this way, a test signal of an external test circuit electrically connected to the test pads ET1 is transmitted to the first test signal line 22.

It should be noted that the embodiments of the present disclosure are not limited to the connection manner of the test pad leads EL and the first test signal lines 22 shown in FIG. 3. In another embodiment, it may be designed that the first to sixth test pad leads EL starting from the left are electrically connected to the first parts 221 of the six first test signal lines 22, respectively.

For example, as shown in FIG. 2A and FIG. 5, the plurality of second test signal lines 23 are electrically connected to the test circuit CT and the plurality of first test signal lines 22, that is, the plurality of second test signal lines 23 and the plurality of first test signal lines 22 are electrically connected in a one-to-one correspondence. Orthographic projections of the second parts 222 of the plurality of first test signal lines 22 onto the base substrate 100 at least partially overlap orthographic projections of the plurality of second test signal lines 23 onto the base substrate 100. The second parts 222 of the plurality of first test signal lines 22 and the plurality of second test signal lines 23 all extend to the first bonding area 24 and are connected to each other, and the second parts 222 of the plurality of first test signal lines 22 cross the plurality of second test signal lines 23, respectively. Both the display signal provided by the signal input element bonded with the first bonding area 24 and the test signal transmitted by the first test signal line 22 may be provided to the sub-pixel 101 via the CT through the second test signal line 23.

For example, as shown in FIG. 2A and FIG. 5, the second parts 222 of the first test signal lines 22 include a first sub-conductive layer 201 and a second sub-conductive layer 202, and the second test signal line 23 and the third sub-conductive layer 203 are arranged in a same layer. The second test signal lines 23 are located on a side of the second part 222 of the first test signal line 22 away from the base substrate 100, and are spaced apart and insulated from the first test signal lines 22. Therefore, when orthographic projections of the second parts 222 of the plurality of first test signal lines 22 onto the base substrate 100 overlap orthographic projections of the plurality of second test signal lines 23 onto the base substrate 100, signal crosstalk does not occur.

For example, as shown in FIG. 2A and FIG. 5, the first bonding area 24 includes a plurality of contact pads 241. The plurality of contact pads 241 are configured to be bond with a signal input element. Part of the plurality of contact pads 241 is electrically connected to the test circuit CT to provide display signals to the plurality of sub-pixels 101.

For example, as shown in FIG. 5, the plurality of contact pads 241 includes a plurality of first contact pads 243 (for example, located on the left side in the figure). The second part 222 of each of the plurality of first test signal lines 22 and each of the plurality of second test signal lines 23 extend to one end of the plurality of first contact pads 243 away from the first bonding area 24, and are electrically connected to one end of a corresponding one of the first contact pads 243 away from the first bonding area 24. That is, the plurality of first test signal lines 22 and the plurality of second test signal lines 23 extend to one end of the plurality of first contact pads 243 away from the first bonding area 24 in a one-to-one correspondence, so that at the position of the end of the plurality of first contact pads 243 away from the first bonding area 24, the plurality of first test signal lines 22 and the plurality of second test signal lines 23 are electrically connected to the plurality of first contact pads 243 in a one-to-one correspondence. Since the second parts 222 of the first test signal lines 22 and the second test signal lines 23 are in different layers, the second parts 222 of the first test signal lines 22 and the second test signal lines 23 are connected by jumpers. For example, the second test signal line 23 is electrically connected to the second part 222 of the first test signal line 22 through a via hole penetrating the interlayer insulating layer 144.

For example, as shown in FIG. 2A and FIG. 3, the display substrate 1 further includes at least one first electrostatic discharge unit ESD1. For example, the at least one first electrostatic discharge unit ESD1 shown in FIG. 3 includes a plurality of first electrostatic discharge units ESD1. The first electrostatic discharge units ESD1 are located on a side of the plurality of test pads ET1 close to the display area 10, and some of the plurality of test pad leads EL pass through the first electrostatic discharge units ESD1 and are electrically connected to the first electrostatic discharge units ESD1. For example, for the test pad leads EL on both sides in the figure, each test pad lead EL is electrically connected to a first electrostatic discharge unit ESD1. The first electrostatic discharge unit ESD1 is configured to remove or reduce static electricity in the test pad lead EL to ensure signal stability in the test pad lead EL.

It should be noted that each of the plurality of test pad leads EL may also be electrically connected to one first electrostatic discharge unit ESD1, and the embodiments of the present disclosure are not limited to the arrangement shown in FIG. 3. In other embodiments, it is also possible to set whether a test pad lead EL is electrically connected to a first electrostatic discharge unit ESD1 according to a signal transmitted in the test pad lead EL.

For example, as shown in FIG. 3, among the plurality of test pad leads EL, any other test pad leads EL except the test pad leads EL electrically connected to the plurality of first test signal lines 22 extend away from the test pads ET1, and further overlap with the first parts 221 of the first test signal lines 22. Orthographic projection of the test pad leads EL, which are not electrically connected to the first test signal lines 22, onto the base substrate 100 overlap orthographic projections of the first parts 221 of the first test signal lines 2 onto the base substrate 100. For example, a portion of the first parts 221 of the first test signal lines 22 that overlaps the test pad leads EL includes a first sub-conductive layer 201 and a second sub-conductive layer 202, and the test pad lead EL and the third sub-conductive layer 203 are in the same layer. That is, in FIG. 3, the other portion of the first parts 221 of the first test signal lines 22 that does not overlap the test pad leads EL includes a first sub-conductive layer 201, a second sub-conductive layer 202, and a third sub-conductive layer 203. In this case, the test pad lead EL is located in a different layer from the portion of the first parts 221 of the first test signal lines 22 that overlaps the test pad leads EL, to avoid signal crosstalk. At the same time, during the aging process, the heat quantity generated by the first test signal line is reduced and the heat dissipation is increased, thereby being beneficial to solve the problem of burns in the traces during the aging process and improving the product yield of display panels.

For example, as shown in FIG. 4, the display substrate 1 further includes at least one second electrostatic discharge unit ESD2 and at least one electrostatic lead ESL located in the peripheral area 20. For example, as shown in FIG. 4, the display substrate 1 may include a plurality of second electrostatic discharge units ESD2. As an example, the number of the second electrostatic discharge units ESD2 may be 6, to correspond to the number of the first test signal lines 22. The embodiments of the present disclosure are not limited thereto. For example, the at least one electrostatic lead ESL includes a plurality of electrostatic leads ESL, and the plurality of electrostatic leads ESL are electrically connected to the plurality of second electrostatic discharge units ESD2, respectively.

As shown in FIG. 2A, the plurality of second electrostatic discharge units ESD2 are located between the plurality of test pads ET1 and the first bonding area 24 in the first direction X, and the plurality of second electrostatic discharge units ESD2 are arranged in the first direction X.

For example, as shown in FIG. 4, the electrostatic leads ESL extend along the second direction Y and are electrically connected to the plurality of first test signal lines 22, respectively, so that the second electrostatic discharge unit ESD2 removes or reduces the static electricity in the first test signal line 22, thereby ensuring the stability of signals in the first test signal lines 22.

For example, as shown in FIG. 4, the display substrate 1 may also include one or more resistors R1 connected to the second electrostatic discharge unit(s) ESD2, and both ends of one resistor R1 are electrically connected to the same second electrostatic discharge unit ESD2 (for example, the second electrostatic discharge unit ESD2 on the right side of the figure).

Figure 7A:
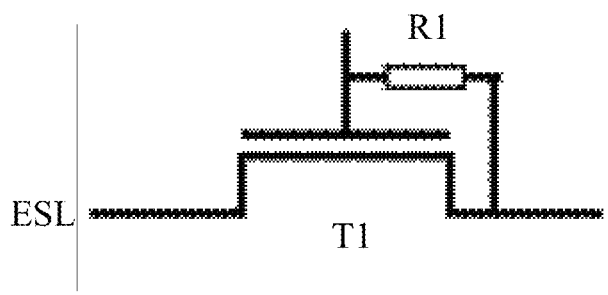
FIG. 7A is a schematic diagram of a circuit principle of a second electrostatic discharge unit in FIG. 4 according to an embodiment of the present disclosure.
Figure 7B:
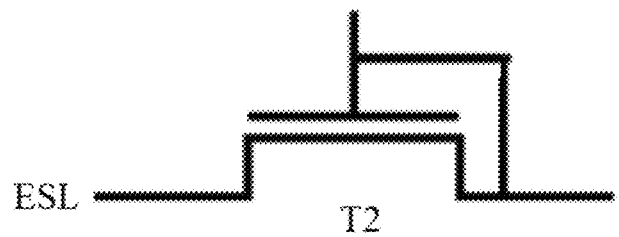
FIG. 7B is a schematic diagram of a circuit principle of a second electrostatic discharge unit in FIG. 4 according to another embodiment of the present disclosure.

FIG. 7A is a schematic diagram of a circuit principle of a second electrostatic discharge unit in FIG. 4 according to an embodiment of the present disclosure; and FIG. 7B is a schematic diagram of a circuit principle of a second electrostatic discharge unit in FIG. 4 according to another embodiment of the present disclosure.

FIG. 7A shows an exemplary schematic diagram of the circuit principle of the second electrostatic discharge unit ESD2 electrically connected to the resistor R1. As shown in FIG. 7A, the electrostatic lead ESL is electrically connected to a first thin film transistor T1. For example, one of source and drain electrodes of the first thin film transistor T1 is shorted to its gate electrode to form a diode structure, so as to have unidirectional conduction characteristics. A resistor R1 is electrically connected between one of the source and drain electrodes of the first thin film transistor T1 and the gate transistor thereof to improve the conductivity of the first thin film transistor T1. When a signal transmitted in the first test signal line 22 electrically connected to the electrostatic lead ESL is a high-stage signal, the first thin film transistor T1 is turned on, to discharge the static electricity on the first test signal line 22.

FIG. 7B shows an exemplary schematic diagram of the circuit principle of the second electrostatic discharge unit ESD2 that is not electrically connected to the resistor R1. As shown in FIG. 7B, the electrostatic lead ESL is electrically connected to the second thin film transistor T2. For example, one of source and drain electrodes of the second thin film transistor T2 is shorted to its gate electrode to form a diode structure, to have unidirectional conduction characteristics. When a signal transmitted by the first test signal line 22 electrically connected to the electrostatic lead ESL is a high-stage signal, the second thin film transistor T2 is turned on, and the electrostatic charge on the first test signal line 22 is discharged.

For example, as shown in FIG. 4, the plurality of electrostatic leads ESL are arranged in parallel in a first direction X (for example, a horizontal direction), and the first parts 221 of the plurality of first test signal lines 22 are arranged in parallel in a second direction Y (for example, a vertical direction), and are electrically connected with the plurality of electrostatic lead ESL in one-to-one correspondence. That is, extension directions of the plurality of electrostatic leads ESL and the plurality of first test signal lines 22 cross each other, which are electrically connected correspondingly. An orthographic projection of the first part 221 of the first test signal line 22 onto the base substrate 100 overlaps an orthographic projection of the electrostatic lead ESL onto the base substrate 100. As shown in the figure, the electrostatic lead ESL on the far right is electrically connected to the first part 221 of the first test signal line 22 that is farthest from the second electrostatic unit ESD2, and overlaps the other first test signal lines 22 (the other five of first test signal lines 22); the penultimate electrostatic lead ESL on the right side is electrically connected to the first part 221 of the second one of the first test signal lines 22 (numbering from the side away from the second electrostatic discharge unit ESD2), and overlaps other first test signal lines 22 (the other four of first test signal lines 22) that are close to the second electrostatic discharge unit ESD2 relative to the second one of the first test signal lines 22, and so on. For example, the antepenultimate electrostatic lead ESL on the right overlaps three of the first test signal lines 22. An overlapping portion of the first parts 221 of the plurality of first test signal lines 22 that overlap the plurality of electrostatic leads ESL includes a first sub-conductive layer 201 and a second sub-conductive layer 202. That is, the other portion of the first parts 221 of the plurality of first test signal lines 22 that does not overlap the electrostatic leads ESL in FIG. 4 includes the first sub-conductive layer 201, the second sub-conductive layer 202, and the third sub-conductive layer 203. For example, the electrostatic lead ESL and the third sub-conductive layer 203 are provided in the same layer. In this case, the electrostatic lead ESL is located in a different film layer from the overlapping portion of the first part 221 of the first test signal line 22 that overlaps the electrostatic lead ESL, to avoid signal crosstalk. At the same time, during the aging process, the heat quantity generated by the first test signal line is reduced and the heat dissipation is increased, thereby being beneficial to solve the problem of burns in the traces during the aging process and improving the product yield of display panels.

For example, as shown in FIG. 2A, the display substrate further includes a plurality of signal leads 242. The plurality of signal leads 242 are electrically connected to some of the plurality of contact pads 241 of the first bonding area 24 and the test circuit CT.

Figure 8A:
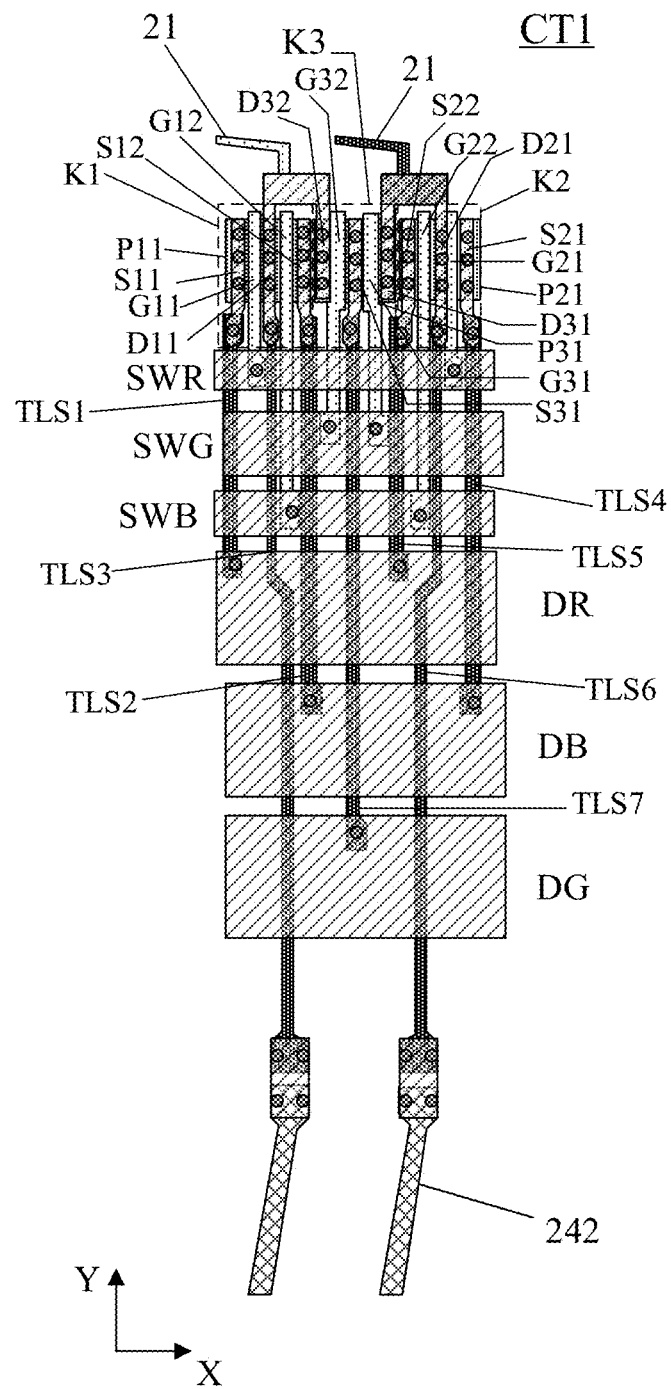
FIG. 8A is a schematic diagram of a test unit provided by an embodiment of the present disclosure.
Figure 8B:
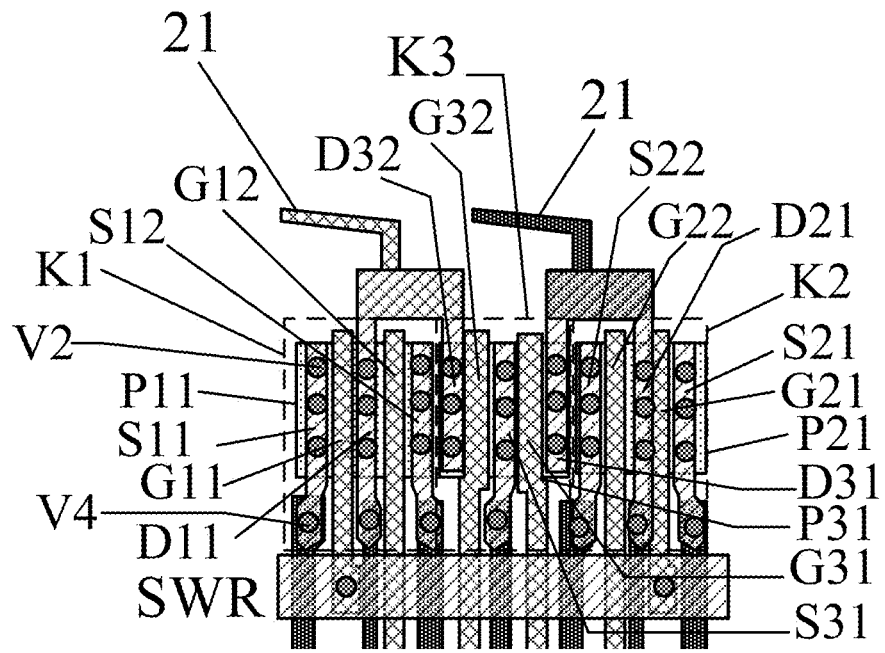
FIG. 8B is a partial enlarged schematic diagram of FIG. 8A according to an embodiment of the present disclosure.

For example, FIG. 8A is a schematic diagram of the layout of a test unit provided by an embodiment of the present disclosure. FIG. 8B is a partial enlarged schematic diagram of FIG. 8A according to an embodiment of the present disclosure. As shown in FIG. 8A and FIG. 8B, the test circuit CT includes a plurality of test units CT1. The test unit CT1 includes a first multiplexing switch K1, a second multiplexing switch K2, a third multiplexing switch K3, a first control line SWR, a second control line SWG, a third control line SWB, a first signal line DR, a second signal line DB and a third signal line DG. The plurality of second test signal lines 23 are electrically connected to the first control line SWR, the second control line SWG, the third control line SWB, the first signal line DR, the second signal line DB, and the third signal line DG, so as to transmit a test signal provided by the first test signal line 22 to the test unit CT1.

For example, as shown in FIG. 8A and FIG. 8B, at least one gate electrode of the first multiplexing switch K1 (for example, including a first gate electrode G11 of the first multiplexing switch and a second gate electrode G12 of the first multiplexing switch) is electrically connected to the control line SWR or the third control line SWB. At least one source electrode of the first multiplexing switch K1 (for example, including a first source electrode S11 of the first multiplexing switch and a second source electrode S12 of the first multiplexing switch) is electrically connected to the first signal line DR or the second signal line DB. At least one drain electrode of the first multiplexing switch K1 (for example, including a drain electrode D11 of the first multiplexing switch) is electrically connected to one of the plurality of data leads 21.

At least one gate electrode of the second multiplexing switch K2 (for example, including a first gate electrode G21 of the second multiplexing switch and a second gate electrode G22 of the second multiplexing switch) is electrically connected to the first control line SWR or the third control line SWB. At least one source electrode of the second multiplexing switch K2 (for example, including a first source S21 electrode of the second multiplexing switch and a second source electrode S22 of the second multiplexing switch) is electrically connected to the first signal line DR or the second signal line DB. At least one drain electrode of the second multiplexing switch K2 (for example, including a drain electrode D21 of the second multiplexing switch) is electrically connected to another data lead of the plurality of data leads 21.

At least one gate electrode of the third multiplexing switch K3 (for example, including a first gate electrode G31 of the third multiplexing switch and a second gate electrode G32 of the third multiplexing switch) is electrically connected to the second control line SWG. At least one source electrode of the third multiplexing switch K3 (for example, including a first source electrode S31 of the third multiplexing switch) is electrically connected to the third signal line DG. At least one drain electrode of the third multiplexing switch K3 (for example, including a first drain electrode D31 of the third multiplexing switch and a second drain electrode D32 of the third multiplexing switch) is electrically connected to one of the plurality of data leads 21 and the other one of the plurality of data leads 21 (that is, two data leads 21 electrically connected to the at least one drain electrode of the second multiplexing switch K2 and the at least one drain electrode of the second multiplexing switch K1, respectively).

For example, as shown in FIG. 8A, the first multiplexing switch K1 includes a first multiplexing switch active layer P11, a first multiplexing switch first gate electrode G11, a first multiplexing switch second gate electrode G12, a first multiplexing switch drain electrode D11, a first multiplexing switch first source electrode S11, a first multiplexing switch second source electrode S12. The first multiplexing switch active layer P11 is located on the base substrate 100, the first multiplexing switch first gate electrode G11 and the first multiplexing switch second gate electrode G12 are located on a side of the first multiplexing switch active layer P11 away from the base substrate 100, which are separated by the first insulating layer 142 (not shown in the figure for simplicity of the figure). An orthographic projection of the first multiplexing switch first gate electrode G11 onto the base substrate 100 is spaced apart from an orthographic projection of the first multiplexing switch second gate electrode G12 onto the base substrate 100.

The first multiplexing switch drain electrode D11, the first multiplexing switch first source electrode S11, and the first multiplexing switch second source electrode S12 are located at a side of the first multiplexing switch first gate electrode G11 and the first multiplexing switch second gate electrode G12 away from the base substrate 100, which are separated by the second insulating layer 143 and the interlayer insulating layer 144 (not shown in the figure for simplicity of the figure). The first multiplexing switch drain electrode D11 is located between the first multiplexing switch first source electrode S11 and the first multiplexing switch second source electrode S12.

An orthographic projection of the first multiplexing switch first gate electrode G11 onto the base substrate 100 is located between orthographic projections of the first multiplexing switch first source electrode S11 and the first multiplexing switch drain electrode D11 onto the base substrate 100, an orthographic projection of the first multiplexing switch second gate electrode G12 onto the base substrate 100 is located between orthographic projections of the first multiplexing switch second source electrode S12 and the first multiplexing switch drain electrode D11 onto the base substrate 100.

The first multiplexing switch first gate electrode G1 is electrically connected to the first control line SWR, and the first multiplexing switch second gate electrode G12 is electrically connected to the third control line SWB. The first multiplexing switch first source electrode S11 is electrically connected to the first signal line DR through a first transfer electrode TLS1, and the first multiplexing switch second source electrode S12 is electrically connected to the third signal line DB through a second transfer electrode TLS2. The first multiplexing switch drain electrode D11 is electrically connected to a signal lead 242 (in left side in FIG. 8A) through a third transfer electrode TLS3, and the first multiplexing switch drain electrode D11 is also connected to the data lead 21 (in left side in FIG. 8A), so as to provide a display signal provided by the signal input element bonded in the first bonding area 24 to the sub-pixel 101 in a display stage. In a testing stage, the first multiplexing switch K1 is turned on under the control of control signals provided by the first control line SWR and the third control line SWB, and transmits signals provided by the first signal line DR and the third signal line DB to the sub-pixel 101, through the first multiplexing switch drain electrode D11.

For example, as shown in FIG. 8A, the first transfer electrode TLS1, the second transfer electrode TLS2, and the third transfer electrode TLS3 are located between the gate electrode of the first multiplexing switch K1, and the source and drain electrodes of the first multiplexing switch K1. That is, the first transfer electrode TLS1, the second transfer electrode TLS2, and the third transfer electrode TLS3 are separated, by the second insulating layer 143, from the first multiplexing switch first gate electrode G11 and the first multiplexing switch second gate electrode G12. The first transfer electrode TLS1, the second transfer electrode TLS2, and the third transfer electrode TLS3 are separated, by the interlayer insulating layer 144, from the first multiplexing switch drain electrode D11, the first multiplexing switch first source electrode S11, and the first multiplexing switch second source electrode S12.

For example, as shown in FIG. 8A and FIG. 8B, the second multiplexing switch K2 includes a second multiplexing switch active layer P21, a second multiplexing switch first gate electrode G21, a second multiplexing switch second gate electrode G22, a second multiplexing switch drain electrode D21, a second multiplexing switch first source electrode S21, and a second multiplexing switch second source electrode S22. The second multiplexing switch active layer P21 is located on the base substrate 100, the second multiplexing switch first gate electrode G21 and the second multiplexing switch second gate electrode G22 are located on a side of the second multiplexing switch active layer P21 away from the base substrate 100, which are separated by the first insulating layer 142 (not shown in the figure). An orthographic projection of the second multiplexing switch first gate electrode G21 onto the base substrate 100 is spaced apart from an orthographic projection of the second multiplexing switch second gate electrode G22 onto the base substrate 100.

The second multiplexing switch drain electrode D21, the second multiplexing switch first source electrode S21, and the second multiplexing switch second source electrode S22 are located at a side of the second multiplexing switch first gate electrode G21 and the second multiplexing switch second gate electrode G22 away from the base substrate 100, which are separated by the second insulating layer 143 and the interlayer insulating layer 144 (not shown in the figure). The second multiplexing switch drain electrode D21 is located between the second multiplexing switch first source electrode S21 and the second multiplexing switch second source electrode S22

An orthographic projection of the second multiplexing switch first gate electrode G21 onto the base substrate 100 is located between orthographic projections of the second multiplexing switch first source electrode S21 and the second multiplexing switch drain electrode D21 onto the base substrate 100. An orthographic projection of the second multiplexing switch second gate electrode G22 onto the base substrate 100 is located between orthographic projections of the second multiplexing switch second source electrode S22 and the second multiplexing switch drain electrode D21 onto the base substrate 100.

The second multiplexing switch first gate electrode G21 is electrically connected to the first control line SWR, and the second multiplexing switch second gate electrode G22 is electrically connected to the third control line SWB. The second multiplexing switch first source electrode S21 is electrically connected to the third signal line DB through the fourth transfer electrode TLS4, and the second multiplexing switch second source electrode S22 is electrically connected to the first signal line DR through the fifth transfer electrode TLS5. The second multiplexing switch drain electrode D21 is electrically connected to the signal lead 242 (on the right side in FIG. 8A) through the sixth transfer electrode TLS6, and the second multiplexing switch drain electrode D21 is also connected to the data lead 21 (on the right side in FIG. 8A), so as to provide a display signal provided by the signal input element bonded in the first bonding area 24 to the sub-pixel 101 in the display stage. In a testing stage, the second multiplexing switch K2 is turned on under the control of control signals provided by the first control line SWR and the third control line SWB, and transmits signals provided by the first signal line DR and the third signal line DB to the sub-pixel 101, through the second multiplexing switch drain electrode D21.

For example, as shown in FIG. 8A, the fourth transfer electrode TLS4, the fifth transfer electrode TLS5, and the sixth transfer electrode TLS6 are located between the gate electrode of the second multiplexing switch K2, and the source and drain electrodes of the second multiplexing switch K2. That is, the fourth transfer electrode TLS4, the fifth transfer electrode TLS5, and the sixth transfer electrode TLS6 are separated, by the second insulating layer 143, from the second multiplexing switch first gate electrode G21 and the second multiplexing switch second gate electrode G22. The fourth transfer electrode TLS4, the fifth transfer electrode TLS5, and the sixth transfer electrode TLS6 are separated, by the interlayer insulating layer 144, from the second multiplexing switch drain electrode D21, the second multiplexing switch first source electrode S21, and the second multiplexing switch second source electrode S22.

For example, as shown in FIG. 8A and FIG. 8B, the third multiplexing switch K3 includes a third multiplexing switch active layer P31, a third multiplexing switch first gate electrode G31, a third multiplexing switch second gate electrode G32, a third multiplexing switch source electrode S31, a third multiplexing switch first drain D31, and a third multiplexing switch second drain electrode D32. The third multiplexing switch active layer P31 is located on the base substrate 100, the third multiplexing switch first gate electrode G31 and the third multiplexing switch second gate electrode G32 are located on a side of the third multiplexing switch active layer P31 away from the base substrate 100, which are separated by the first insulating layer 142 (not shown in the figure). An orthographic projection of the third multiplexing switch first gate electrode G31 onto the base substrate 100 is spaced apart from an orthographic projection of the third multiplexing switch second gate electrode G32 onto the base substrate 100.

The third multiplexing switch source electrode S31, the third multiplexing switch first drain electrode D31, and the third multiplexing switch second drain electrode D32 are located at a side of the third multiplexing switch first gate electrode G31 and the third multiplexing switch second gate electrode G32 away from the base substrate 100, which are separated by the second insulating layer 143 and the interlayer insulating layer 143 (not shown in the figure). The third multiplexing switch source electrode S31 is located between the third multiplexing switch first drain electrode D31 and the third multiplexing switch second drain electrode D32.

An orthographic projection of the third multiplexing switch first gate electrode G31 onto the base substrate 100 is located between orthographic projections of the third multiplexing switch first drain electrode D31 and the third multiplexing switch source electrode S31 onto the base substrate 100. An orthographic projection of the third multiplexing switch second gate electrode G32 onto the base substrate 100 is located between orthographic projections of the third multiplexing switch second drain electrode D32 and the third multiplexing switch source electrode S32 onto the base substrate 100.

The third multiplexing switch first drain electrode D31 is electrically connected to the data lead 21 (located on the right side in FIG. 8A), and the third multiplexing switch second drain electrode D32 is electrically connected to the data lead 21 (located on the left side in FIG. 8A). The third multiplexing switch first gate electrode G31 and the third multiplexing switch second gate electrode G32 are electrically connected to the second control line SWG, and the third multiplexing switch source electrode S31 is electrically connected to the third signal line DG through a seventh transfer electrode TSL7. In a testing stage, the third multiplexing switch K3 is turned on under the control of a control signal provided by the second control line SWG, and transmits a signal provided by the third signal line DG to the sub-pixel 101 through the third multiplexing switch first drain electrode D31 and the third multiplexing switch second drain electrode D32.

For example, as shown in FIG. 8A, the seventh transfer electrode TSL7 is located between the gate electrode of the third multiplexing switch K3 and the source and drain electrodes of the third multiplexing switch K3. That is, the seventh transfer electrode TSL7 is spaced apart, by the second insulating layer 143, from the third multiplexing switch first gate electrode G31 and the third multiplexing switch second gate electrode G32. The seventh switching electrode TSL7 is spaced apart, by the interlayer insulating layer 144, from the third multiplexing switch source electrode S31, the third multiplexing switch first drain D31, and the third multiplexing switch second drain electrode D32.

It should be noted that the first multiplexing switch K1, the second multiplexing switch K2, and the third multiplexing switch K3 are electrically connected to the sub-pixels 101 in different columns through the data leads 21, correspondingly.

Figure 2B:
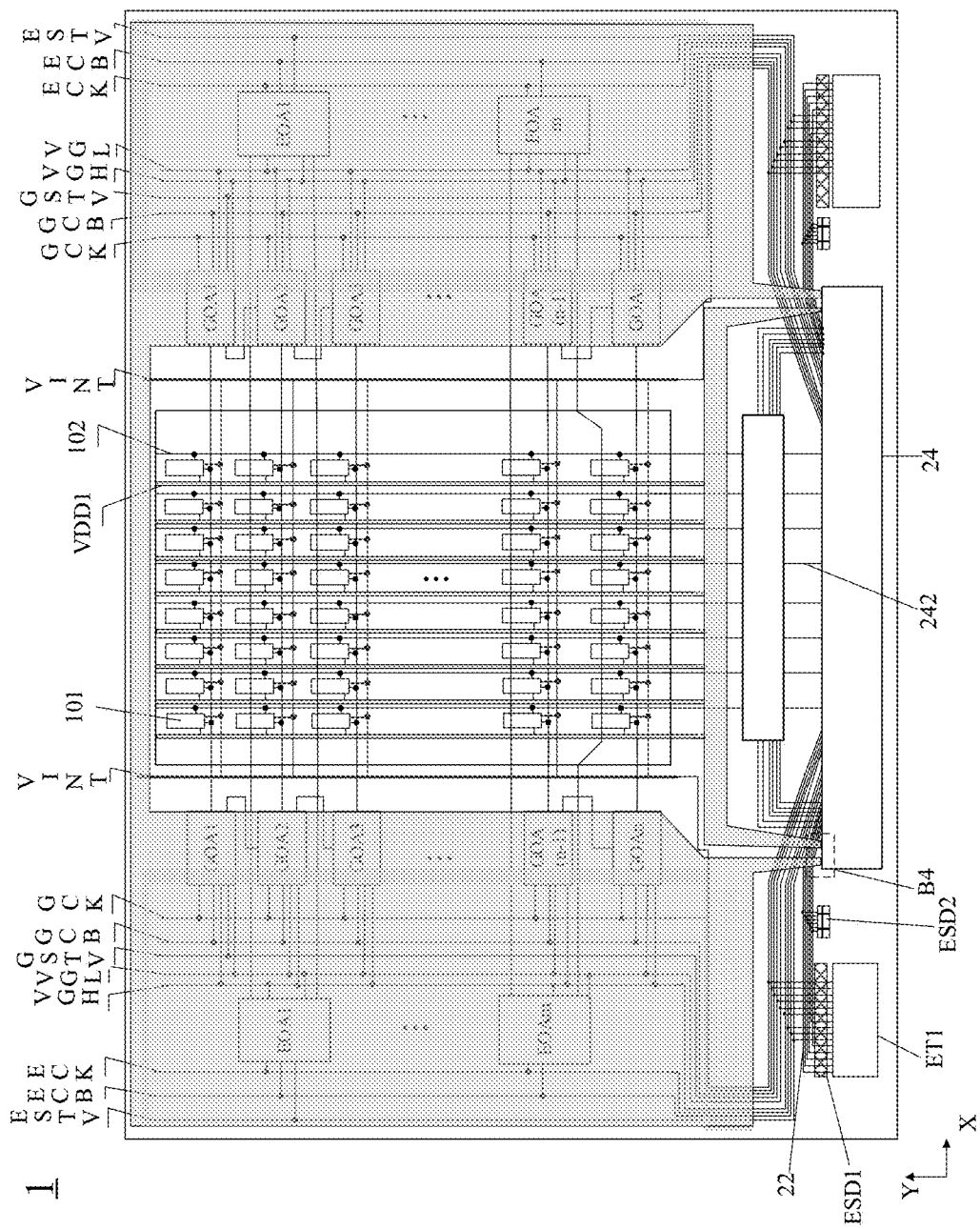
FIG. 2B is a schematic diagram of a display substrate provided by still another embodiment of the present disclosure.
Figure 9:
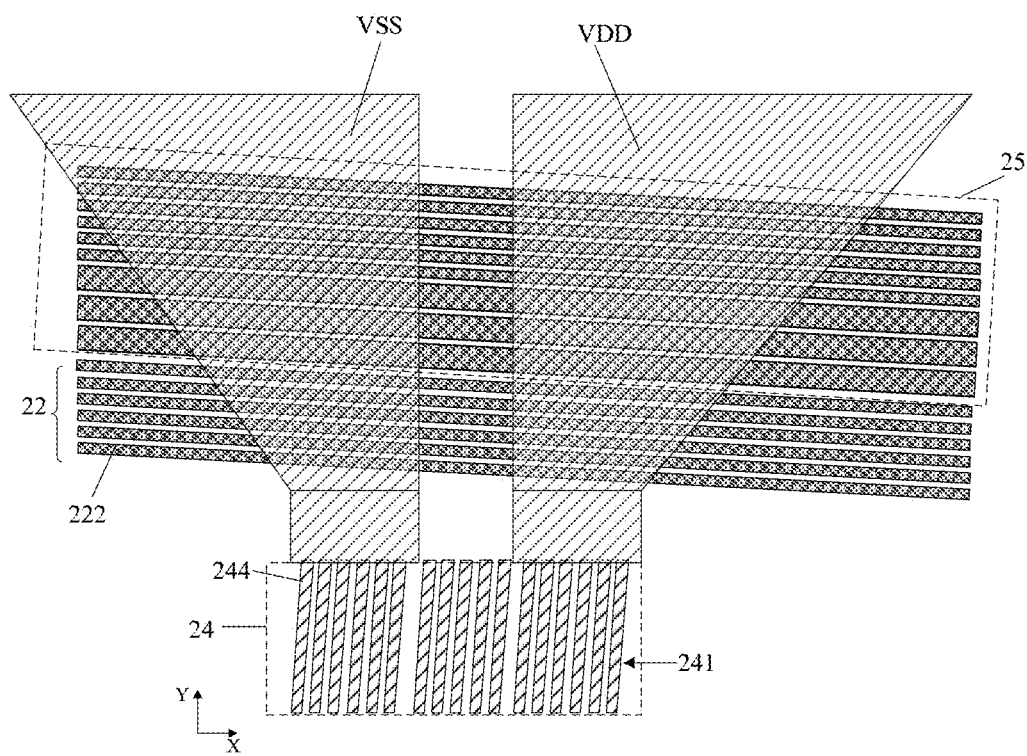
FIG. 9 is an enlarged schematic diagram of area B4 in FIG. 2B.

For example, FIG. 2B is a schematic diagram of a display substrate provided by still another embodiment of the present disclosure; FIG. 9 is an enlarged schematic diagram of area B4 in FIG. 2B. As shown in FIG. 2B and FIG. 9, the display substrate 1 further includes a first power supply line VSS and a second power supply line VDD located in the peripheral area 20, and the first power supply line VSS is located on a side of the second power supply line VDD close to the test pad ET1.

For example, as shown in FIG. 9, the plurality of contact pads 241 further includes a plurality of second contact pads 244, and the plurality of second contact pads 244 are located on a side of the plurality of first contact pads 243 proximate to the test pad ET1 (shown in FIG. 5). Some of the plurality of second contact pads 244 are configured to be electrically connected to the first power supply line VSS, and some other second contact pads 244 are electrically connected to the second power supply line VDD, so that a signal provided by the signal input element electrically connected to the first bonding area 24 is provided to the sub-pixels 101.

For example, as shown in FIG. 2B and FIG. 9, the first power supply line VSS is configured to provide a first power supply signal to the plurality of sub-pixels 101, and the first power supply line VSS is electrically connected to a part of the second contact pads 244 (the part on the left side in FIG. 9) and extends around the display area 10. The second power supply line VDD is configured to provide a second power supply signal to the plurality of sub-pixels 101, and the second power supply line VDD is electrically connected to another part of the second contact pads 244 (the part on the right side in FIG. 9) and extends between the display area 10 and the test circuit CT. The display substrate 1 also includes a plurality of second power supply signal lines VDD1 located in the display area 10. The second power supply signal lines VDD1 are electrically connected to the second power supply lines VDD, and each of the second power supply signal lines VDD1 is electrically connected to a corresponding column of sub-pixels 101.

It should be noted that the second power supply line VDD is a power supply line that supplies a high voltage to the plurality of sub-pixels 101, and the first power supply line VSS is a power supply line that supplies a low voltage (lower than the aforementioned high voltage) to the plurality of sub-pixels 101. In the embodiment shown in FIG. 2B, the second power supply line VDD supplies a constant second power supply voltage, and the second power supply voltage is a positive voltage; the first power supply line VSS supplies a constant first power supply voltage, and the first power supply voltage may be a negative voltage and so on. For example, in some examples, the first power supply voltage may be a ground voltage.

For example, as shown in FIG. 9, the first power supply line VSS and the second power supply line VDD are located on the side of the second parts 222 of the first test signal lines 22 away from the base substrate 100, and orthographic projections of the first power supply line VSS and the second power supply line VDD onto the base substrate 100 overlap with the orthographic projections of the second parts 222 of the first test signal lines 22 onto the base substrate 100. Since the first power supply line VSS and the second power supply line VDD are in different layers from the second parts 222 of the first test signal lines 22, signal crosstalk can be avoided.

For example, as shown in FIG. 1 and FIG. 2A, the display substrate 1 further includes a shift register GOA and a light-emission controller EOA located in the peripheral area 20 (for example, located on both sides of the display area 10 of the display substrate 1). The shift register GOA includes a plurality of shift register units that are cascaded, such as an n-stage shift register unit (for example, a first-stage shift register unit GOA1, a second-stage shift register unit GOA2, . . . the n-th stage shift register unit GOAn). Each stage of the shift register units is configured to provide a gate scan signal to the sub-pixels 101 located in a row through a gate line GN in the display area 10. The light-emission controller EOA includes a plurality of light-emission control units that are cascaded, such as an m-stage light-emission control units (eg, a first-stage light-emission control unit EOA1, a second-stage light-emission control unit EOA2, . . . the m-th light-emission control unit EOAm). Each stage of the light-emission control units is configured to provide emission control signals to the sub-pixels 101 in at least one row (for example, two rows of sub-pixels 101) through the light-emission control line EM in the display area 10. For example, the light-emission control unit is also a shift register unit, for example, has the same circuit structure as the shift register unit of the shift register GOA.

For example, as shown in FIG. 2A, the display substrate 1 further includes a first clock signal line GCB, a second clock signal line GCK, a third clock signal line ECB, a fourth clock signal line ECK, a first trigger signal line GSTV, a second trigger signal line ESTV, a third power supply line VGH, a fourth power supply line VGL, and a initialization signal line VINT. The first clock signal line GCB and the second clock signal line GCK are electrically connected to the n-stage shift register unit, and the first trigger signal line GSTV is electrically connected to the first-stage shift register unit GOA1, so as to provide a first clock signal, a second clock signal and a first trigger signal, respectively. The third clock signal line ECB and the fourth clock signal line ECK are electrically connected to the m-stage light-emission control unit, and the second trigger signal line ESTV is electrically connected to the first level light-emission control unit EOA1, so as to provide a third clock signal, a fourth clock signal and a second trigger signal, respectively. The third power supply line VGH and the fourth power supply line VGL are electrically connected to the n-stage shift register unit and the m-stage light-emission control unit, respectively, in order to provide a third power supply signal and a fourth power supply signal, respectively. The initialization signal line VINT is configured to be electrically connected to the plurality of sub-pixels 101 and provide an initialization signal to the plurality of sub-pixels 101. For example, the initialization signal line VINT also provides a constant low voltage, which may be a negative voltage or the like. For example, in some examples, the low voltage may be a ground voltage.

It should be noted that in FIG. 2A, each of the n-stage shift register unit, the m-stage light-emission control unit, the first clock signal line GCB, the second clock signal line GCK, the third clock signal line ECB, the fourth clock signal line ECK, the first trigger signal line GSTV, the second trigger signal line ESTV, the third power supply line VGH, the fourth power supply line VGL and the initialization signal line VINT is symmetrically arranged on both sides of the display area 10, that is, driving in double sides. According to the circuit configuration requirements of the display substrate 1, driving in a single side may also be adopted, and the embodiments of the present disclosure is not limited to these.

For example, as shown in FIG. 2A, the display substrate 1 further includes a plurality of bending lines 25 on a side of the first test signal lines 22 close to the display area 10, and the plurality of bending lines 25 are arranged in parallel to reduce the wiring space. The plurality of bending lines 25 are respectively connected to the first clock signal line GCB, the second clock signal line GCK, the third clock signal line ECB, the fourth clock signal line ECK, the first trigger signal line GSTV, the second trigger signal line ESTV, the third power supply line VGH, the fourth power supply line VGL, and the initialization signal line VINT.

For example, as shown in FIG. 5, the plurality of bending lines 25 extend to the first bonding area 24 and are electrically connected to the contact pads 241 to provide a signal provided by the signal input element bonded to the first bonding area 24 to the sub-pixels 101. For example, the contact pad 241 is electrically connected to the bending line 25 through a via hole. For another example, the contact pad 241 is electrically connected to the bending line 25 through a via hole penetrating the interlayer insulating layer 144.

For example, as shown in FIG. 5 and FIG. 9, orthographic projections of the plurality of bending lines 25 onto the base substrate 100 overlap with orthographic projections of the first power supply line VSS, the second power supply line VDD, and the second test signal line 23 onto the base substrate 100. The bending lines 25 include two conductive layers, for example, the two conductive layers are respectively arranged in the same layers as the first sub-conductive layer 201 and the second sub-conductive layer 202 in FIG. 6.

In other embodiments, the bending lines 25 may include a single conductive layer, for example, the conductive layer is arranged in the same layer as the first sub-conductive layer 201 or the second sub-conductive layer 202, and the embodiments of the present disclosure is not limited thereto.

For example, as shown in FIG. 3, test pad leads EL that are not electrically connected to the first test signal lines 22 are electrically connected to the plurality of bending lines 25, respectively. The test pad leads EL electrically connected to the bending lines 25 overlap the first parts 221 of the plurality of first test signal lines 22, that is, orthographic projections of the first parts 221 of the plurality of first test signal lines 22 onto the base substrate 100 overlap with orthographic projections of the test pad leads EL electrically connected to the plurality of bending lines 25 onto the base substrate 100. An overlapping portion of the first parts 221 of the first test signal lines 22 that overlaps the test pad leads EL electrically connected to the bending lines 25 includes a first sub-conductive layer 201 and a second sub-conductive layer 202. In FIG. 3, the other portion of the first parts 221 of the first test signal lines 22 that does not overlap the test pad leads EL electrically connected to the bending lines 25 includes the first sub-conductive layer 201, the second sub-conductive layer 202, and the third sub-conductive layer 203. In this case, the test pad leads EL are located in a different film layer from the overlapping portion of the first parts 221 of the first test signal line 22 that overlaps the test pad leads EL, to avoid signal crosstalk. At the same time, during the aging process, the heat quantity generated by the first test signal line is reduced and the heat dissipation is increased, thereby being beneficial to solve the problem of burns in the traces during the aging process and improving the product yield of display panels.

Figure 10:
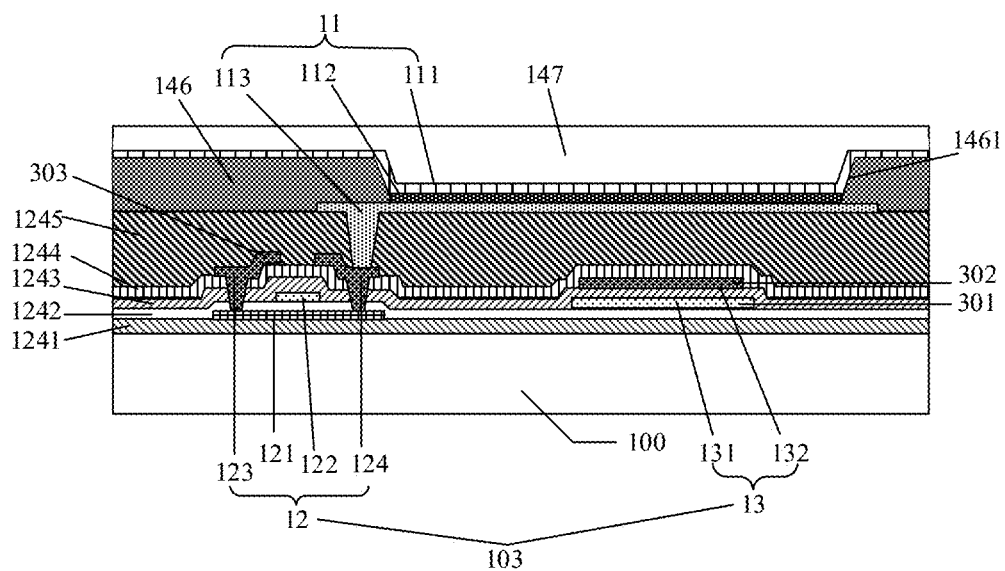
FIG. 10 is a schematic cross-sectional view of a display area of a display substrate provided by an embodiment of the present disclosure.

For example, FIG. 10 is a schematic cross-sectional view of a display area of a display substrate provided by an embodiment of the present disclosure. As shown in FIG. 10, each of the plurality of sub-pixels 101 includes a pixel structure, and the pixel structure includes a pixel driving circuit 103. The pixel driving circuit 103 includes a first metal layer 301, a second metal layer 302, and a third metal layer 303. The first metal layer 301 is located on the base substrate 100, that is, between a first insulating layer 1242 in the display area and a second insulating layer 1243 in the display area. The second metal layer 302 is located on a side of the first metal layer 301 away from the base substrate 100, that is, between the second insulating layer 1243 in the display area and an interlayer insulating layer 1244 in the display area. The third metal layer 303 is located on a side of the second metal layer 302 away from the base substrate 100, that is, on a side of the interlayer insulating layer 1244 in the display area away from the base substrate 100. For example, the first sub-conductive layer 201, the second sub-conductive layer 202, and the third sub-conductive layer 203 of the first test signal line 22 in FIG. 6 are arranged in the same layers and made of the same materials as the first metal layer 301, the second metal layer 302, and the third metal layer, respectively.

It should be noted that in the embodiments of the present disclosure, "arranged in the same layer" includes that two functional layers or structural layers are formed in the same layer and with the same material in a hierarchical structure of the display substrate. That is, in the preparation process, the two functional layers or structural layers are formed by a same material layer, and a pattern and structure required by the two functional layers or structural layers can be formed through one patterning process. The one patterning process includes, for example, photoresist formation, exposure, development and etching.

For example, as shown in FIG. 10, the pixel driving circuit 103 further includes a plurality of transistors and capacitors. The plurality of transistors include transistors directly electrically connected to a light-emitting device. The transistors are, for example, switching transistors (such as light-emission control transistors) or driving transistors. The plurality of capacitors include storage capacitors (to store a written data signal). In an embodiment, the pixel driving circuit 103 includes a driving transistor 12 and a storage capacitor 13. The driving transistor 12 includes a gate electrode 122, a source electrode 123, a drain electrode 124, and an active layer 121. The display substrate 1 further includes a display area buffer layer 1241, a display area first insulating layer 1242, a display area second insulating layer 1243, and a display area interlayer insulating layer 1244. The storage capacitor 13 includes a first electrode plate 131 and a second electrode plate 132. The first electrode plate 131 and the second electrode plate 132 are stacked oppositely. The display area buffer layer 1241 is located on the base substrate 100. The active layer 121 is disposed on the base substrate 100 and is located on a side of the display area buffer layer 1241 away from the base substrate 100. The display area first insulating layer 1242 is located on a side of the active layer 121 away from the base substrate 100, and the gate electrode 122 and the first electrode plate 131 are arranged in a same layer and on a side of the display area first insulating layer 1242 away from the base substrate 100. The display area second insulating layer 1243 is located on a side of the gate electrode 122 and the first electrode plate 131 away from the base substrate 100. The second electrode plate 132 is disposed on a side of the display area second insulating layer 1243 away from the base substrate 100. The display area interlayer insulating layer 1244 is located on a side of the second electrode plate 132 away from the base substrate 100. The source electrode 123 and the drain electrode 124 are arranged on a side of the display area interlayer insulating layer 1244 away from the base substrate 100, and are electrically connected to the active layer 121 through a via hole in the display area first insulating layer 1242, the display area second insulating layer 1243, and the display area interlayer insulating layer 1244. The gate electrode 122 and the first electrode plate 131 are located on the first metal layer 301, the second electrode plate 132 is located on the second metal layer 302, and the source electrode 123 and the drain electrode 124 are located on the third metal layer 303.

For example, as shown in FIG. 10 and FIG. 6, the display area buffer layer 1241, the display area first insulating layer 1242, the display area second insulating layer 1243, and the display area interlayer insulating layer 1244 are arranged in the same layers and made of the same materials as the buffer layer 141, the first insulating layer 142, the second insulating layer 143, and the interlayer insulating layer 144, respectively.

For example, a material of the active layer 121 may include polysilicon or an oxide semiconductor (for example, indium gallium zinc oxide (IGZO)). A material of the gate electrode 122 may include a metal material or an alloy material, such as a metal single-layer or multi-layer structure made of molybdenum, aluminum, and titanium, etc. For example, the multi-layer structure is a multi-metal-layer laminate (such as a three-layer metal laminate of titanium, aluminum and titanium (Ti/Al/Ti)). The material of the source electrode 123 and the drain electrode 124 may include a metal material or an alloy material, such as a metal single-layer or multi-layer structure made of molybdenum, aluminum, and titanium, etc. For example, the multi-layer structure is a multi-metal-layer laminate (such as a three-layer metal laminate of titanium, aluminum and titanium (Ti/Al/Ti)). The embodiments of the present disclosure do not specifically limit the material of each functional layer.

For example, as shown in FIG. 10, the display substrate 1 further includes a first planarization layer 1245. The first planarization layer 1245 is located on a side of the source electrode 123 and the drain electrode 124 away from the base substrate 100 to provide a first planarized surface, so as to planarize the surface of the pixel driving circuit 103 away from the base substrate 100. The first planarization layer 1245 includes a via hole, and the pixel driving circuit 103 is electrically connected to the light-emitting device through the via hole. The first planarization layer 1245 and the third insulating layer 145 are arranged in the same layer.

For example, the material of the first planarization layer 1245 includes inorganic insulating materials such as silicon oxide, silicon nitride, silicon oxynitride, etc., and may also include organic insulating materials such as polyimide, polyphthalimide, polyamide, acrylic resin, benzocyclobutene, and phenol-formaldehyde resin, which are not limited in the embodiments of the present disclosure.

For example, a passivation layer may also be provided between the first planarization layer 1245 and the source electrode 123 and the drain electrode 124. It may be designed that he passivation layer included a via hole to expose one of the source electrode 123 and the drain electrode 124, for example, to expose the drain electrode 124. The passivation layer can protect the source electrode 123 and the drain electrode 124 from being corroded by water vapor. For example, the material of the passivation layer may include organic insulating materials or inorganic insulating materials, for example, silicon nitride material, which can better protect the pixel driving circuit 103 and avoid water vapor corroding, due to its high dielectric constant and good hydrophobic function.

For example, as shown in FIG. 10, the display substrate 1 further includes a pixel defining layer 146 and a light-emitting device 11. The pixel defining layer 146 is located on a side of the first planarization layer 1245 away from the base substrate 14 and includes a first pixel opening 1461. The first pixel opening 1461 is arranged corresponding to the light-emitting device 11. The light-emitting device 11 includes a first electrode 113 (for example, an anode), a light-emitting layer 112, and a second electrode 111 (for example, a cathode). The first electrode 113 is located on a side of the first planarization layer 1245 away from the base substrate 100, and is electrically connected to the pixel driving circuit 103 (for example, the drain electrode 124 of the driving transistor 12) through the via hole of the first planarization layer 1245. The second electrode 111 is located on a side of the pixel defining layer 146 away from the base substrate 100. The light-emitting layer 112 is located in the first pixel opening 1461 and located between the first electrode 113 and the second electrode 111. The portion of the light-emitting layer 112 directly sandwiched between the first electrode 113 and the second electrode 111 will emit light after being energized, so the area occupied by this portion corresponds to a light-emitting area of the light-emitting device 11.

For example, the pixel driving circuit 103 generates a light-emission drive current under the control of a data signal provided by the data driving circuit through the data line 102, a gate scanning signal provided by the shift register unit through the gate line GN, a light-emission control signal provided by the light-emission control unit through the light-emission control line EM, and a power supply signal provided by the power supply signal line VDD1. The light-emission drive current enables the light-emitting device 11 to emit red light, green light, blue light, or white light.

For example, the pixel driving circuit 103 includes a conventional 7T1C (that is, seven transistors and one capacitor) pixel circuit. The seven transistors include at least one switching transistor and a driving transistor (such as the driving transistor 103 shown in FIG. 10). A gate electrode of the switch transistor is electrically connected to the shift register unit to receive a signal behind the gate electrode, and a source or drain electrode of the switch transistor is connected to the data line 102 to receive a data signal. In different embodiments, the pixel driving circuit 103 may further include a compensation circuit, and the compensation circuit may include an internal compensation circuit or an external compensation circuit. The compensation circuit may include a transistor, a capacitor, and the like. For example, the pixel circuit may also include a reset circuit, a light-emission control circuit, a detection circuit, etc., as required. The embodiments of the present disclosure do not limit the type of the first light-emitting device and the specific structure of the pixel circuit.

For example, the material of the pixel defining layer 146 may include organic insulating materials such as polyimide, polyphthalimide, polyamide, acrylic resin, benzocyclobutene, or phenol-formaldehyde resin, or inorganic materials such as silicon oxide and silicon nitride, which is not limited in the embodiments of the present disclosure.

For example, the material of the first electrode 113 may include at least one transparent conductive oxide material, including indium tin oxide (ITO), indium zinc oxide (IZO), zinc oxide (ZnO), and the like. In addition, the first electrode 113 may include a metal having high reflectivity as a reflective layer, such as silver (Ag).

For example, for OLED, the light-emitting layer 112 may include small molecular organic materials or polymer molecular organic materials, may be fluorescent light-emitting materials or phosphorescent light-emitting materials, and may emit red light, green light, blue light, or may emit white light. As required, the light-emitting layer may further include functional layers such as an electron injection layer, an electron transport layer, a hole injection layer, and a hole transport layer.

For QLED, the light-emitting layer may include quantum dot materials such as, silicon quantum dots, germanium quantum dots, cadmium sulfide quantum dots, cadmium selenide quantum dots, cadmium telluride quantum dots, zinc selenide quantum dots, lead sulfide quantum dots, lead selenium quantum dots, indium phosphide quantum dots and indium arsenide quantum dots, etc. The particle size of the quantum dots ranges from 2 nm to 20 nm.

For example, the second electrode 111 may include various conductive materials. For example, the second electrode 111 may include metal materials such as lithium (Li), aluminum (Al), magnesium (Mg), and silver (Ag).

For example, as shown in FIG. 10, the display substrate 1 further includes an encapsulation layer 147. The encapsulation layer 147 is located on a side of the second electrode 111 away from the base substrate 100. The encapsulation layer 147 seals the light-emitting device 11 (light-emitting device 11), so that deterioration of the light-emitting device 11 caused by moisture and/or oxygen included in the environment may be reduced or prevented. The encapsulation layer 147 may be a single-layer structure or a composite layer structure, and the composite layer structure includes a stacked structure of an inorganic layer and an organic layer. The encapsulation layer 147 includes at least one encapsulation sublayer. For example, the encapsulation layer 147 may include a first inorganic encapsulation layer, a first organic encapsulation layer, and a second inorganic encapsulation layer that are sequentially arranged.

For example, the material of the encapsulation layer 147 may include insulating materials such as silicon nitride, silicon oxide, silicon oxynitride, and polymer resin. Inorganic materials such as silicon nitride, silicon oxide, and silicon oxynitride have high density and can prevent the intrusion of water and oxygen. The material of the organic encapsulation layer may be a polymer material including a desiccant or a polymer material that can block water vapor, etc. For example, polymer resins may be used to planarize the surface of the display substrate, and can relieve the stress of the first inorganic encapsulation layer and the second inorganic encapsulation layer, and can also include water-absorbing materials such as desiccant to absorb other substances such as water and oxygen intruding into its interior.

Figure 11:
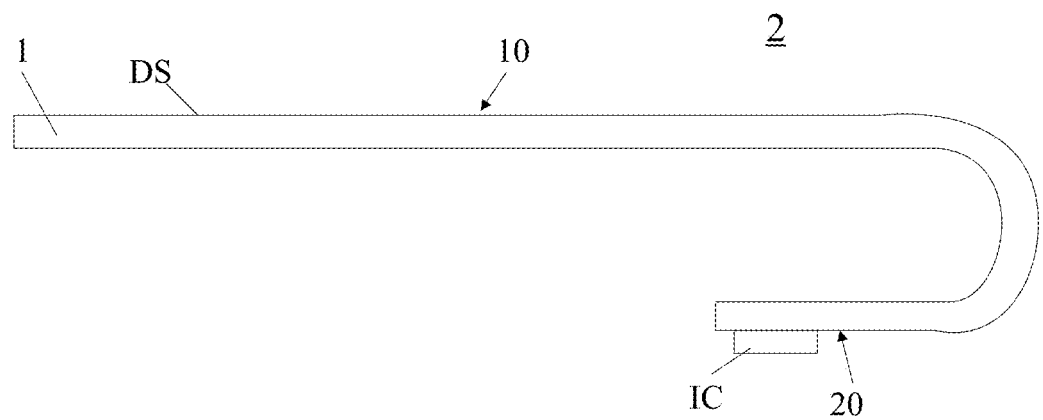
FIG. 11 is a schematic diagram of a display device provided by an embodiment of the present disclosure.

At least one embodiment of the present disclosure also provides a display device. FIG. 11 is a schematic diagram of a display device provided by an embodiment of the present disclosure. As shown in FIG. 11, the display device 2 includes the display substrate 1 provided by any embodiment of the present disclosure and a signal input element. For example, the display substrate 1 is the display substrate 1 shown in FIG. 2B.

As shown in FIG. 11, a portion of the display substrate 1 located in the peripheral area 20 is bent to a back side of a portion of the display substrate 1 located in the display area 10. For example, the back side refers to an operation side of the display substrate 1 (or a side opposite to the side where a plurality of sub-pixels 101 (shown in FIG. 2B) are provided). When the base substrate 100 adopts a flexible base substrate, it is advantageous to perform the bending operation. The display device 2 formed by the bending process has a narrow frame. For example, the signal input element includes a data driving circuit IC. The data driving circuit IC provides a display signal of the display substrate 1 in a display stage, so as to enable the sub-pixels 101 to display a picture.

It should be noted that the display device 2 may be any product or component with a display function, such as an OLED panel, an OLED TV, a QLED panel, a QLED TV, a mobile phone, a tablet computer, a notebook computer, a digital photo frame, a navigator, and the like. The display device 2 may also include other components, such as a data driving circuit, a timing controller, etc., which are not limited in the embodiments of the present disclosure.

It should be noted that, for the sake of clarity and conciseness, the embodiments of the present disclosure do not provide all the constituent units of the display device. In order to realize the substrate function of the display device, those skilled in the art can provide and set other structures not shown according to specific needs, which are not limited in the embodiments of the present disclosure.

Regarding the technical effects of the display device 2 provided by the above-mentioned embodiments, reference may be made to the technical effects of the display substrate 1 provided in the embodiments of the present disclosure, which will not be repeated herein.

The following points need to be explained: (1) the drawings of the embodiments of the present disclosure only involves the structures related to the embodiments of the present disclosure, and other structures can refer to a usual design; (2) in the case of no conflict, the embodiments of the present disclosure and the features in the embodiments can be combined with each other to obtain new embodiments.

The above embodiments are only specific implementations of the present disclosure, but the protection scope of the present disclosure is not limited thereto. Any person skilled in the art can easily conceive of changes or substitutions within the technical scope disclosed in the present disclosure, all of which shall fall within the protection scope of the present disclosure. Therefore, the protection scope of the present disclosure should be subject to the protection scope of the claims.

What is claimed is:

1. A display substrate, comprising:
    a base substrate comprising a display area and a peripheral area on at least one side of the display area;
    a plurality of sub-pixels in the display area;
    a plurality of data lines that is in the display area, is electrically connected to the plurality of sub-pixels, and is configured to provide data signals to the plurality of sub-pixels;
    a test circuit in the peripheral area;
    a plurality of data leads that is in the peripheral area and is electrically connected to the plurality of data lines and the test circuit;
    at least one test pad in the peripheral area and on at least one side of the test circuit; and
    at least one first test signal line in the peripheral area, wherein the at least one first test signal line is electrically connected to the at least one test pad and the test circuit,
    wherein, at least a part of the at least one first test signal line comprises at least two conductive layers that are connected in parallel and electrically connected to each other,
    wherein the test circuit comprises a plurality of test units, and at least one of the plurality of test units comprises a first multiplexing switch, a second multiplexing switch, a third multiplexing switch, a first control line, a second control line, a third control line, a first signal line, a second signal line and a third signal line;
    wherein the display substrate further comprises a plurality of test pad leads, the at least one first test signal line comprises a plurality of first test signal lines, and the at least one test pad comprises a plurality of test pads;
    the plurality of test pad leads extends along a second direction different from the first direction, and is electrically connected to the plurality of test pads, respectively;
    wherein the display substrate further comprises:
    at least one first electrostatic discharge unit, wherein the at least one first electrostatic discharge unit is on a side of the plurality of test pads close to the display area, and at least part of the plurality of test pad leads passes through the at least one first electrostatic discharge unit, and is connected to the at least one first electrostatic discharge unit;
    or,
    at least one second electrostatic discharge unit and at least one electrostatic lead located in the peripheral area, wherein the at least one second electrostatic discharge unit is located between the plurality of test pads and the first bonding area in the first direction, and the at least one electrostatic lead extends in the second direction, and is respectively electrically connected to at least one of the plurality of first test signal lines and the at least one second electrostatic discharge unit.

2. The display substrate according to claim 1, wherein at least a part of the at least one first test signal line comprises three conductive layers that are connected in parallel and electrically connected to each other.

3. The display substrate according to claim 2, wherein each first test signal line of the at least one first test signal line comprises a first part and a second part, the first part extends in a first direction, and the second part extends in a direction crossing the first direction; and
    the first part is electrically connected to the at least one test pad and the second part, and the second part is further electrically connected to the test circuit.

4. The display substrate according to claim 3, wherein the first part of the at least one first test signal line comprises a first sub-conductive layer, a second sub-conductive layer, and a third sub-conductive layer, and
    the first sub-conductive layer, the second sub-conductive layer, and the third sub-conductive layer are separated by insulating layers, and are electrically connected in parallel through via holes in the insulating layers.

5. The display substrate according to claim 4, wherein each of the plurality of sub-pixels comprises a pixel structure, and the pixel structure comprises a pixel driving circuit,
    wherein, the pixel driving circuit comprises a first metal layer, a second metal layer, and a third metal layer, the first metal layer is on the base substrate, the second metal layer is on a side of the first metal layer away from the base substrate, and the third metal layer is on a side of the second metal layer away from the base substrate; and the first sub-conductive layer is arranged in a same layer as the first metal layer, the second sub-conductive layer is arranged in a same layer as the second metal layer, and the third sub-conductive layer is arranged in a same layer as the third metal layer.

6. The display substrate according to claim 3, wherein the pixel driving circuit further comprises a driving transistor, a storage capacitor, a first insulating layer, a second insulating layer, and an interlayer insulating layer, the first insulating layer is on a side of the first metal layer close to the base substrate, the second insulating layer is between the first metal layer and the second metal layer, and the interlayer insulating layer is between the second metal layer and the third metal layer, the first transistor comprises a gate electrode, a source electrode, a drain electrode and an active layer, and the storage capacitor comprises a first electrode plate and a second electrode plate, the active layer is on a side of the first insulating layer close to the base substrate, the gate electrode and the first electrode plate are in the first metal layer, the second electrode plate is in the second metal layer, and the source electrode and the drain electrode are in the third metal layer, and the first sub-conductive layer and the second sub-conductive layer are electrically connected in parallel through a via hole that penetrates the second insulating layer, and the second sub-conductive layer and the third sub-conductive layer are electrically connected in parallel by through a via hole that penetrates the interlayer insulating layer.

7. The display substrate according to claim 5, further comprising a plurality of second test signal lines, a part of the plurality of test pad leads is electrically connected to the first parts of the plurality of first test signal lines, and the plurality of second test signal lines is electrically connected to the test circuit and the plurality of first test signal lines, and orthographic projections of the second parts of the plurality of first test signal lines onto the base substrate partially overlap with orthographic projections of the plurality of second test signal lines onto the base substrate.

8. The display substrate according to claim 7, wherein the second part of each of the plurality of first test signal lines comprises the first sub-conductive layer and the second sub-conductive layer, and the plurality of second test signal lines and the third metal layer are arranged in a same layer.

9. The display substrate according to claim 7, wherein the plurality of second test signal lines is electrically connected to the first control line, the second control line, the third control line, the first signal line, the second signal line and the third signal line, at least one gate electrode of the first multiplexing switch is electrically connected to the first control line or the third control line, at least one source electrode of the first multiplexing switch is electrically connected to the first signal line or the second signal line, and at least one drain electrode of the first multiplexing switch is electrically connected to one data lead of the plurality of data leads, at least one gate electrode of the second multiplexing switch is electrically connected to the first control line or the third control line, at least one source electrode of the second multiplexing switch is electrically connected to the first signal line or the second signal line, and at least one drain electrode of the second multiplexing switch is electrically connected to another one data lead of the plurality of data leads, and at least one gate electrode of the third multiplexing switch is electrically connected to the second control line, at least one source electrode of the third multiplexing switch is electrically connected to the third signal line, and at least one drain electrode of the third multiplexing switch is electrically connected to the one data lead of the plurality of data leads and the other one data lead of the plurality of data leads.

10. The display substrate according to claim 9, wherein the first multiplexing switch comprises a first multiplexing switch active layer, a first multiplexing switch first gate electrode, a first multiplexing switch second gate electrode, a first multiplexing switch drain electrode, a first multiplexing switch first source electrode, and a first multiplexing switch second source electrode, the first multiplexing switch active layer is on the base substrate, the first multiplexing switch first gate electrode and the first multiplexing switch second gate electrode are located on a side of the first multiplexing switch active layer away from the base substrate, and an orthographic projection of the first multiplexing switch first gate electrode onto the base substrate is spaced apart from an orthographic projection of the first multiplexing switch second gate electrode onto the base substrate;

the first multiplexing switch drain electrode, the first multiplexing switch first source electrode, and the first multiplexing switch second source electrode are located on a side of the first multiplexing switch first gate electrode and the first multiplexing switch second gate electrode away from the base substrate, and the first multiplexing switch drain electrode is located between the first multiplexing switch first source electrode and the first multiplexing switch second source electrode, wherein, an orthographic projection of the first multiplexing switch first gate electrode onto the base substrate is located between orthographic projections of the first multiplexing switch first source electrode and the first multiplexing switch drain electrode onto the base substrate, an orthographic projection of the first multiplexing switch second gate electrode onto the base substrate is located between orthographic projections of the first multiplexing switch second source electrode and the first multiplexing switch drain electrode onto the base substrate, and the first multiplexing switch first gate electrode is electrically connected to the first control line, and the first multiplexing switch second gate electrode is electrically connected to the third control line.

11. The display substrate according to claim 9, wherein the second multiplexing switch comprises a second multiplexing switch active layer, a second multiplexing switch first gate electrode, a second multiplexing switch second gate electrode, a second multiplexing switch drain electrode, a second multiplexing switch first source electrode and a second multiplexing switch second source electrode, the second multiplexing switch active layer is located on the base substrate, the second multiplexing switch first gate electrode and the second multiplexing switch second gate electrode are located on a side of the second multiplexing switch active layer away from the base substrate, and an orthographic projection of the second multiplexing switch first gate electrode onto the base substrate is spaced apart from an orthographic projection of the second multiplexing switch second gate electrode onto the base substrate;

the second multiplexing switch drain electrode, the second multiplexing switch first source electrode, and the second multiplexing switch second source electrode are located on a side of the second multiplexing switch first gate electrode and the second multiplexing switch second gate electrode away from the base substrate, and the second multiplexing switch drain electrode is located between the second multiplexing switch first source electrode and the second multiplexing switch second source electrode, wherein, an orthographic projection of the second multiplexing switch first gate electrode onto the base substrate is located between orthographic projections of the second multiplexing switch first source electrode and the second multiplexing switch drain electrode onto the base substrate, an orthographic projection of the second multiplexing switch second gate electrode onto the base substrate is located between orthographic projections of the second multiplexing switch second source electrode and the second multiplexing switch drain electrode onto the base substrate, and the second multiplexing switch first gate electrode is electrically connected to the first control line, and the second multiplexing switch second gate electrode is electrically connected to the third control line.

12. The display substrate according to claim 9, wherein the third multiplexing switch comprises a third multiplexing switch active layer, a third multiplexing switch first gate electrode, a third multiplexing switch second gate electrode, a third multiplexing switch source electrode, a third multiplexing switch first drain electrode and a third multiplexing switch second drain electrode, the third multiplexing switch active layer is on the base substrate, the third multiplexing switch first gate electrode and the third multiplexing switch second gate electrode are located on a side of the third multiplexing switch active layer away from the base substrate, and an orthographic projection of the third multiplexing switch first gate electrode onto the base substrate is spaced apart from an orthographic projection of the third multiplexing switch second gate electrode onto the base substrate;

the third multiplexing switch source electrode, the third multiplexing switch first drain electrode, and the third multiplexing switch second drain electrode are located on a side of the third multiplexing switch first gate electrode and the third multiplexing switch second gate electrode away from the base substrate, and the third multiplexing switch source electrode is located between the third multiplexing switch first drain electrode and the third multiplexing switch second drain electrode, wherein, an orthographic projection of the third multiplexing switch first gate electrode onto the base substrate is located between orthographic projections of the third multiplexing switch first drain electrode and the third multiplexing switch source electrode onto the base substrate, an orthographic projection of the third multiplexing switch second gate electrode onto the base substrate is located between orthographic projections of the third multiplexing switch second drain electrode and the third multiplexing switch source electrode onto the base substrate, and the third multiplexing switch first drain electrode is electrically connected to one of the plurality of data leads, and the third multiplexing switch second drain electrode is electrically connected to another one of the plurality of data leads.

13. The display substrate according to claim 9, wherein the peripheral area further comprises a first bonding area, the first bonding area is on a side of the test circuit away from the display area, the first bonding area is spaced apart from the at least one test pad in the first direction, and the first bonding area is configured to be bond to a signal input element, and comprises a plurality of contact pads, and a part of the plurality of contact pads is electrically connected to the test circuit.

14. The display substrate according to claim 13, further comprising a plurality of signal leads, wherein the plurality of signal leads is electrically connected to another part of the plurality of contact pads and the test circuit, at least one drain electrode of the first multiplexing switch is also electrically connected to one of the plurality of signal leads, and at least one drain electrode of the second multiplexing switch is also electrically connected to another one of the plurality of signal leads.

15. The display substrate according to claim 13, wherein the plurality of contact pads comprises a plurality of first contact pads, the second part of each of the plurality of first test signal lines and each of the plurality of second test signal lines extend to one end of the plurality of first contact pads away from the first bonding area, and are electrically connected to the one end of a corresponding one of the first contact pads away from the first bonding area.

16. The display substrate according to claim 15, further comprising: a first power supply line and a second power supply line located in the peripheral area, wherein the first power supply line is on a side of the second power supply line close to the test pad, the plurality of contact pads further comprises a plurality of second contact pads, and the plurality of second contact pads is on a side of the plurality of first contact pads close to the at least one test pad, the first power supply line is configured to supply a first power supply signal to the plurality of sub-pixels, and the first power supply line is electrically connected to a part of the plurality of second contact pads and surrounds the display area, the second power supply line is configured to supply a second power supply signal to the plurality of sub-pixels, and the second power supply signal is electrically connected to another part of the plurality of second contact pads and extends to the display area, and the first power supply line and the second power supply line are on a side of the second parts of the plurality of first test signal lines away from the base substrate, and orthographic projections of the first power supply line and the second power supply line onto the base substrate overlap with the orthographic projections of the second parts of the plurality of the first test signal lines onto the base substrate.

17. The display substrate according to claim 1, wherein the at least one electrostatic lead comprises a plurality of electrostatic leads, and the plurality of electrostatic leads are arranged in parallel in the first direction, the first parts of the plurality of first test signal lines are arranged in parallel in the second direction, and are electrically connected to the plurality of electrostatic leads, respectively, and the orthographic projections of the first parts of the plurality of first test signal lines onto the base substrate overlap with orthographic projections of the plurality of electrostatic leads onto the base substrate, and an overlapping portion of the first parts of the plurality of first test signal lines overlapping with the plurality of electrostatic leads comprises the first sub-conductive layer and the second sub-conductive layer.

18. The display substrate according to claim 13, further comprising: a shift register unit, a light-emission control unit, a first clock signal line, a second clock signal line, a third clock signal located, a fourth clock signal line, a first trigger signal line, a second trigger signal line, a third power supply line, a fourth power supply line, and an initialization signal line that are located in the peripheral area,
  wherein the shift register unit is configured to provide a gate scan signal to the plurality of sub-pixels, and the light-emission control unit is configured to provide a light-emission control signal to the plurality of sub-pixels,
  the first clock signal line, the second clock signal line and the first trigger signal line are electrically connected to the shift register unit to provide a first clock signal, a second clock signal and a first trigger signal, respectively,
  the third clock signal line, the fourth clock signal line and the second trigger signal line are electrically connected to the light-emission control unit to provide a third clock signal, a fourth clock signal and a second trigger signal, respectively,
  the third power supply line and the fourth power supply line are respectively electrically connected to the shift register unit and the light-emission control unit to provide a third power supply signal and a fourth power supply signal, respectively,
  the initialization signal line is configured to provide an initialization signal to the plurality of sub-pixels,
  the display substrate further comprises a plurality of bending lines located on a side of the plurality of first test signal lines close to the display area, and the plurality of bending lines are respectively electrically connected to at least two of following lines: the first clock signal line, the second clock signal line, the third clock signal line, the fourth clock signal line, the first trigger signal line, the second trigger signal line, the third power supply line, the fourth power supply line and the initialization signal line,
  the plurality of bending lines is also electrically connected to another part of the contact pads, and orthographic projections of the plurality of bending lines onto the base substrate overlap with orthographic projections of the first power supply line, the second power supply line and the second test signal line onto the base substrate, and
  each of the plurality of bending lines comprises two conductive layers, and the two conductive layers of the bending lines are respectively arranged in the same layers as the first metal layer and the second metal layer,
  and,
  wherein the plurality of bending lines is also electrically connected to another part of the test pad leads,
  the orthographic projections of the first parts of the plurality of first test signal lines onto the base substrate overlap with an orthographic projection of the other part of the test pad leads electrically connected to the plurality of bending lines onto the base substrate, and
  an overlapping portion comprise the first sub-conductive layer and the second sub-conductive layer, and the overlapping portion is a portion of the first parts of the plurality of first test signal lines that overlaps with the other part of the test pad leads electrically connected to the plurality of bending lines.

19. A display device, comprising the display substrate according to claim 1.

* * * * *